United States Patent
Hsieh et al.

(10) Patent No.: US 7,407,863 B2
(45) Date of Patent: Aug. 5, 2008

(54) ADHESIVE BONDING WITH LOW TEMPERATURE GROWN AMORPHOUS OR POLYCRYSTALLINE COMPOUND SEMICONDUCTORS

(75) Inventors: Kuang Chien Hsieh, Champaign, IL (US); Keh-Yung Cheng, Champaign, IL (US); Kuo-Lih Chang, Savoy, IL (US); John H. Epple, St. Louis, MO (US); Gregory Pickrell, Zephyr Cove, NV (US)

(73) Assignee: Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 10/680,509

(22) Filed: Oct. 7, 2003

(65) Prior Publication Data

US 2005/0074927 A1  Apr. 7, 2005

(51) Int. Cl.
*H01L 21/76* (2006.01)
(52) U.S. Cl. .............................. 438/406; 257/E21.122
(58) Field of Classification Search ................ 438/107, 438/409, 455, 458, 406, 407, 486, 143; 257/E21.122, 257/E21.128
See application file for complete search history.

(56) References Cited

U.S. PATENT DOCUMENTS

| | | | |
|---|---|---|---|
| 5,233,216 A | 8/1993 | Inoue et al. | |
| 5,854,090 A | 12/1998 | Iwai et al. | |
| 5,858,855 A * | 1/1999 | Kobayashi | 438/406 |
| 5,920,766 A | 7/1999 | Floyd | |
| 6,066,547 A * | 5/2000 | Maekawa | 438/486 |
| 6,867,067 B2 * | 3/2005 | Ghyselen et al. | 438/107 |
| 6,881,644 B2 * | 4/2005 | Malik et al. | 438/409 |

FOREIGN PATENT DOCUMENTS

| | | |
|---|---|---|
| EP | 1 246 238 A2 | 10/2002 |
| JP | 10-12506 | 1/1998 |

OTHER PUBLICATIONS

L.J. Chou, K.C. Hsieh, D.E. Wohlert and K.Y. Cheng, *Formation of Amorphous Aluminum Oxide and Gallium Oxide on InP Substrates by Water Vapor Oxidation*, American Institute of Physics, pp. 6932-6934, Dec. 15, 1998.

(Continued)

*Primary Examiner*—Howard Weiss
*Assistant Examiner*—Hoa B Trinh
(74) *Attorney, Agent, or Firm*—Brinks Hofer Gilson & Lione

(57) ABSTRACT

Amorphous and polycrystalline III-V semiconductor including (Ga,As), (Al,As), (In,As), (Ga,N), and (Ga,P) materials were grown at low temperatures on semiconductor substrates. After growth, different substrates containing the low temperature grown material were pressed together in a pressure jig before being annealed. The annealing temperatures ranged from about 300° C. to 800° C. for annealing times between 30 minutes and 10 hours, depending on the bonding materials. The structures remained pressed together throughout the course of the annealing. Strong bonds were obtained for bonding layers between different substrates that were as thin as 3 nm and as thick as 600 nm. The bonds were ohmic with a relatively small resistance, optically transparent, and independent of the orientation of the underlying structures.

63 Claims, 27 Drawing Sheets

OTHER PUBLICATIONS

L.J. Chou, K.C. Hsieh, A. Moy, D.E. Wohlert, G. Pickrell and K.Y. Cheng, *Improving the Al-Bearing Native-Oxide/GaAs Interface Formed by Wet Oxidation with a Thin GaP Barier Layer*, American Institute of Physics, pp. 2722-2724, May 25, 2003.

K. L. Chang, G.W. Pickrell, D.E. Wohlert, J.H. Epple, H.C. Lin, K.Y. Cheng and K.C. Hsieh, *Microstructure and Wet Oxidation of Low-Temperature-Grown Amorphous (Al/Ga,As)*, American Institute of Physics, vol. 89 No. 1, pp. 747-752, Jan. 1, 2001.

J.J. Epple, K.L. Chang, C.F. Xu, G.W. Pickrell, K.Y. Chang, and K.C. Hsieh, *Formation of Highly Conductive Polycrystalline GaAs from Annealed Amorphous (Ga,As)*, American Institute of Physics, pp. 5331-5336, May 1, 2003.

H.C. Lin, W.H. Wang, K.C. Hsieh and K.Y. Cheng, *Fabrication of 1.55 μm VCSELs on Si Using Metallic Bonding*, Electronics Letters, vol. 38 No. 11, May 23, 2002.

H.C. Lin, K.L. Chang, K.C. Hsieh, K.Y. Cheng, *Metallic Wafer Bonding for the Fabrication of Long-Wavelength Vertical-Cavity Surface-Emitting Lasers*, Journal of Applied Physics, vol. 92 No. 7, pp. 4132-4134, Oct. 1, 2002.

H.C. Lin, K.L. Chang, G.W. Pickrell, K.C. Hsieh and K.Y. Cheng, *Low Temperature Wafer Bonding by Spin on Glass*, Journal of Vacuum Science & Technology B, vol. 20 No. 2, pp. 752-754, Mar./Apr. 2002.

G.W. Pickrell, K.L. Chang, J.H. Epple, K.Y. Chang and K.C. Hsieh, *Protection of $In_{0.25}Ga_{0.75}As/GaAs$ Structures During Lateral Oxidation Using an Amorphous InGaP Layer*, American Vacuum Society, vol. 20 No. 3, pp. 876-879, May/Jun. 2002.

G.W. Pickrell, K.L. Chang, H.C. Lin, K.C. Hsieh and K.Y. Cheng, *Very-Low-Temperature Molecular Beam Epitaxial of GaP/A/As Heterostructures for Distributed Bragg Reflector Applications*, American Vacuum Society; pp. 1536-1540, Jul./Aug. 2001.

G.W. Pickrell, H.C. Lin, K.L. Chang, K.C. Hsieh and K.Y. Cheng; *Fabrication of GaP/Al-Oxide Distributed Bragg Reflectors for the Visible Spectrum*, Applied Physics Letters, vol. 78 No. 8, pp. 1044-1046, Feb. 19, 2001.

Frank Shi, Scott MacLaren, Chaofeng Xu, K.Y. Cheng and K.C. Hsieh, *Hybrid-integrated GaAs/GaAs and InP/GaAs Semiconductors Through Wafer Bonding Technology: Interface Adhesion and Mechanical Strength*: American Institute of Physics, pp. 5750-5756, May 1, 2003.

Frank F. Shi, Kuo-Lih Chang and Veronica I. Lai, *UltraWafer, Inc., A UIUC Semiconductor Start-up, Speeding Up What's Next*, pp. 2-24.

D.E. Wohlert, H.C. Lin, K.L. Chang, G.W. Pickrell, Jr., J.H. Epple, K.C. Hsieh, K.Y. Cheng, *Fabrication of a Substrate-Independent Aluminum Oxide-GaAs Distributed Bragg Reflector*, Applied Physics Letters, vol. 75 No. 10, pp. 1371-1373, Sep. 6, 1999.

International Search Report from corresponding PCT patent application No. PCT/US2004/031254.

K.L. Chang, G.W. Pickrell, K.Y. Cheng and K.C. Hsieh, *Wafer Banding With Low-Temperature-Grown (Ga,P) as an Adhesive Material*, pp. 906-910, Institute of Physics Publishing, Semiconductor Science and Technology, 2004.

K.D. Choquette, K.M. Geib, B. Roberds, H.Q. Hou, R.D. Twesten and B.E. Hammons, *Short Wavelength Bottom-Emitting Vertical Cavity Lasers Fabricated Using Wafer Bonding*, pp. 1404-1405, IEEE, Electronic Letters, vol. 34, No. 14, Jul. 9, 1998.

K. Mori, K. Tokutome and S. Sugou, *Low-Threshold Pulsed Operation of Long-wavelength Lasers on Si Fabricated By Direct Bonding*, pp. 284-285, IEEE Electronic Letters, vol. 31, No. 4, Feb. 16, 1995.

PCT Notification Concerning Transmittal of Copy of International Preliminary Report on Patentability from PCT/US2004/031254.

\* cited by examiner

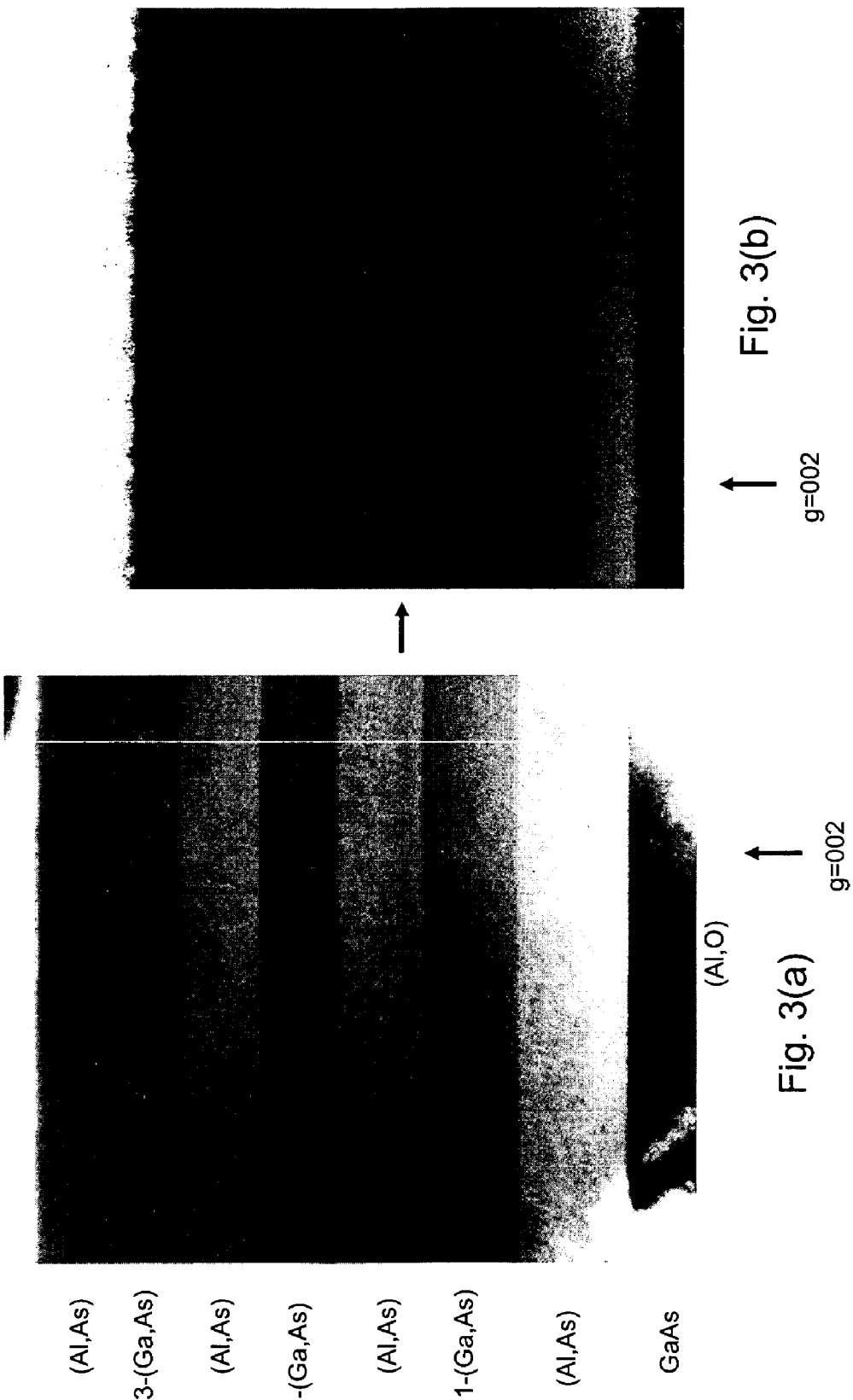

Amorphous (Ga,P) bonding
Anneal at 600 °C for 10 hrs

Polycrystalline (Ga,P) bonding
Anneal at 600 °C for 9 hrs

ADHESIVE BONDING WITH LOW TEMPERATURE GROWN AMORPHOUS OR POLYCRYSTALLINE COMPOUND SEMICONDUCTORS

FEDERALLY SPONSORED RESEARCH OR DEVELOPMENT

This invention was made with Government support under Contract DAAG55-98-1-0303 and Contract MDA972-00-1-0020 awarded by the Defense Advanced Research Projects Agency (DARPA). The Government has certain rights in the invention.

BACKGROUND

1. Technical Field

This invention relates to a method of bonding layers together and in particular relates to a method of bonding semiconductor substrates and device layers together as well as the adhesive bonding layer itself.

2. Background Information

The ability to bond semiconductor materials together has become increasingly important for improving device applications, such as those of high-brightness light emitting diodes (LEDs). Until recently, non-semiconductor materials such as polymer, ceramics and metals have been used as bonding agent (also referred to as a bonding layer) between the two structures to be bonded. Similarly, semiconductor materials provided through epitaxial growth have been used in the bonding process. Each of these materials has disadvantages, however.

Use of epitaxial growth for bonding is especially problematic in certain respects. For example, if single crystal grown material is used and this material has a different lattice constant from the single crystal substrate on which it is grown, strain builds up in the grown material. If this strain is high and the thickness of the grown material exceeds a critical thickness, misfit and threading dislocations that relieve the strain will form in the material. Such defects damage the electrical and optical properties of the material and impede the performance of devices formed with the structure. Selection and growth of particular material that is lattice matched to substrates thus presents one challenge in using epitaxially grown material.

Conventional bonding processes using semiconductor materials have basically consisted of putting two semiconductor wafers together and applying force at certain temperatures to the wafers to make them fuse together. The most extensively used wafer bonding approach used currently is direct wafer bonding. In this technique, the bonding is achieved without any bonding agent between the two semiconductors.

Direct bonding processes employ two different techniques. The first approach consists of contacting one wafer, such as GaAs, and another wafer (for example Si or GaAs) in solution. The two wafers are bonded by natural intermolecular surface forces (Van der Waals bonding). Unfortunately, this type of bonding usually results in very poor current conduction through the bonding interface, thereby limiting the usefulness of the technique. In addition, the bonds formed using this technique are generally very weak unless they are subjected to a high temperature heat treatment (anneal) to convert the Van der Waals bonding into chemical bonding, that is, temperatures well in excess of about 600° C. Unfortunately, large thermal stresses produced during such high temperature annealing can cause problems, in part at least due to differences in the thermal expansion coefficients between the different materials. Such a problem is also present when bonding agents are present between the wafers.

In another approach, two single crystal surfaces of different materials are brought together in contact in an $N_2$ or $H_2$ environment with applied pressure and heat treatment at a temperature higher than that of the above technique. Given a sufficient amount of annealing, these two wafers fuse together. This bonding process involves surface-energy-induced migration and growth, in which interdiffusion of the constituent molecules or atoms of the two materials occurs at the surface. Examples of structures using direct wafer bonding include InP-based semiconductor laser diodes on Si or GaAs substrate which show a uniform bonding interface.

In this approach, although the temperature that must be used varies with the materials used, high temperatures in excess of 600° C. for GaAs and InP, 800° C. for GaP, and 1000° C. for GaN-based materials are used during the heat treatment to ensure that the bonding is strong enough to withstand the further processing. Besides the thermal stresses generated, in many situations involving compound semiconductors, such high temperatures cause the semiconductor materials to structurally break down due to the migration of atoms between layers. This consequently lowers the electrical performance of devices which rely on relatively sharply defined interfaces of the crystalline structure and dopants in the structure.

In addition, as mentioned above, conventional wafer fusion requires strict physical alignment between the structures prior to bonding so that bonding interface can be freely conducting, as shown in the examples of FIGS. 1a and 1b. As illustrated in the graphs of FIGS. 1a and 1b, even a slight misalignment of 6° or less between n-GaP and n-InGaP layers causes a relatively large amount of deviation from pure ohmic characteristics. Thus, alignment is crucial to direct wafer bonding technology since misalignment affects the amount of current flowing through the device. If enough misalignment exists, the number of die that may be used to form the final device decreases, the yield decreases, and the cost consequently increases. Also, extremely flat surfaces are required for the bond to be electrically conductive.

An alternative method to direct wafer bonding, as previously noted, is using a foreign material as a bonding agent, such as Au—Ge metal, spin-on-glass (SOG) or some organic adhesion layer such as an epoxy, photoresist or polyimide. In general, this bonding technique is performed by first depositing the bonding agent on both wafers to be bonded. The bonding agent can be in liquid form and solidified while bonding or be deposited in a solid form. The surfaces are brought in contact and pressed together under a particular pressure at a set temperature. The bonding agents fuse together and hold wafers to achieve heterogeneous integration.

A bonding process that uses such a bonding agent can be performed at lower temperatures than direct wafer bonding. In addition, the bonding is generally chemically and thermally stable at the lower temperatures used. Unfortunately, the use of foreign bonding materials has a number of detrimental consequences in many device applications. Most notably, this technique is not amenable to the subsequent chemical and thermal processes that are employed in semiconductor device manufacturing, such as metal alloying or chemical vapor deposition (such as that used in post-bond growth). High temperatures or temperature cycling used in these later processes cause many of the materials used for bonding to break down, or at least weaken substantially. If an organic adhesion layer is used, additionally such a layer in general changes chemistry upon drying or heating. Furthermore, chemicals, such as acetone, commonly used in further processing dissolve many of such organic adhesive materials. Other materials and specific problems include SOG layers, which have reliability problems or metallic bonding layers, which block light from being transmitted through the bonding layer. The latter, of course, limits the use of the metallic bonding layer in optoelectronic integrated circuit applications. Metal bonds may also undergo extensive alloying in high temperature processing. In addition, most of the materials used in this bonding technique make the bonding electrically isolating; that is, electrical current cannot be conducted across the bond.

Despite each of these techniques having its own problems, conventional direct wafer bonding or wafer bonding with a bonding agent are used in many applications. One of these applications includes LED production, as mentioned above. In LED production, using the direct wafer bonding process, the amount of light from the device may be increased by a factor of 2-3 by wafer bonding the LED to a substrate that is transparent to the wavelength of light emitted by the LED. In one example of this technique, an LED structure that includes an active region of AlGaInP on a GaAs substrate followed by a 50-μm GaP layer is grown using vapor phase epitaxy (VPE). Next, the substrate is etched off, leaving just the active region and the GaP support layer. The GaP layer is used both for support after the GaAs substrate is removed as well as for current spreading. A high density of dislocations form in the GaP current-spreading layer due to the lattice mismatch between GaP and the AlGaInP, but since it is not part of the light emitting region it does not affect the performance. Finally, a GaP substrate, which is transparent to the light emitted by the LED structure, is bonded to the active region at a temperature of at least 800° C. The GaP substrate is transparent as it is an indirect bandgap material whose bandgap is about 2.2 eV, which is larger than the energy of photons emitted by the active region. A similar process having similar results can be achieved in the formation of vertical cavity surface-emitting lasers (VCSELs) used for long-range fiber optic communications.

While the results obtained are desirable, the amount of time spent processing the device, and thus the overall cost of the device, increases dramatically as a result of the exactitude necessary during processing. The growth, wafer alignment, and structural thinning as well as handling of the thinned structure all require a large amount of time and care to maintain a suitable device yield.

It would thus be advantageous to provide a bonding arrangement and method that is relatively simple to grow, in which the bonding layer can be grown on any surface, the various substructures within the overall bonded structure are independent of orientation relative to each other, and in which sensitive preparations are not necessary. Further, it would be advantageous to provide an arrangement and method that is optically transparent for a large range of useful wavelengths, electrically conductive, as well as being performed at a relatively low temperature compared with conventional bonding processes. All of these lead to a product having decreased cost.

BRIEF SUMMARY OF THE INVENTION

In light of these advantages, a low temperature grown semiconductor layer which is either amorphous or polycrystalline (dependent on the material system used and growth conditions) is used to bond substrates together to form a bonded structure. By annealing low temperature grown semiconductor material at a relatively low temperature compared with the temperatures used in conventional direct wafer bonding, a polycrystalline semiconductor material is produced. This polycrystalline semiconductor material provides a bonding layer that may be one or more of the following: relatively simple and cheap to grow and process, grown on any surface, independent of orientation, optically transparent, and electrically conductive. For example, the bond that forms between the substrates is ohmic over a wide range of substrate orientation, i.e. the bond is relatively independent of substrate orientation. Also, as the bonding is performed at a relatively low temperature, atomic rearrangement in the active region of the device is unlikely and the device characteristics remain unaffected by the bonding process.

In one embodiment, the bonded structure comprises a first structure, a second structure, and a low temperature grown semiconductor bonding layer that bonds the first and second structures.

The bonding layer may contain polycrystalline semiconductor material. The bonding layer may have substantially no preferred orientation with respect to either structure, is electrically conductive over a range of voltages used during transparent to light emitted by the bonded structure, or is strong enough to be substantially unaffected by processing of the bonded structure (and may specifically be strong enough to be substantially unaffected by annealing temperatures coupled with annealing times used during regrowth of semiconductor).

The first and second structures may have substantially no preferred orientation with respect to the other structure. At least one of the first and second structures may contain a semiconductor substrate or a substrate that is a non-semiconductor material.

The bonding layer may be between about 3 nm and about 600 nm thick. The bonding layer may comprise low temperature grown semiconductors. More specifically, the bonding layer may comprise low temperature grown (Ga,As) or (Ga,P), (Ga,N), (Ga,Sb), (In,As), ternary compounds such as (In,Ga,P) or (In,Ga,As), or quarternary compounds such as (In,Ga,As,P).

In another embodiment, a method of bonding two structures together comprises depositing a low temperature grown semiconductor bonding layer on first and second structures, placing the bonding layers in contact with each other, applying pressure to a combined structure containing the first and second structures, and annealing the combined structure under conditions sufficient for the bonding layers to bond the first and second structures together.

The method may further comprise applying the pressure substantially uniformly to the combined structure. The annealing of the combined structure may occur under conditions sufficient for the bonding layers to form a polycrystalline material.

The bonding layer may be deposited by molecular beam epitaxy (MBE) at a temperature of about 100° C. In this case, the bonding layer may comprise amorphous (Ga,As) and the annealing of the combined structure occur at a temperature of between about 300° C. and 500° C. and for a time sufficient for the bonding layers to form a polycrystalline (Ga,As) material. Alternatively, the bonding layer may comprise polycrystalline (Ga,P) and the annealing of the combined structure occur at a temperature of between about 500° C. and 700° C. and for a time sufficient for the bonding layers to recrystallize into a polycrystalline (Ga,P) material. The bonding layers may be placed in contact with each other substantially without regard of a relative angular orientation of the first and second structures.

At least one of the first and second structures may comprise a non-semiconductor substrate. An electronic or optoelectronic device may be fabricated from the combined structure.

The annealing of the combined structure may occur under conditions that are not damaging to the first and second structures but are sufficient to form bonds that are strong enough to survive subsequent processing at reasonably high temperatures. The bonding interface produced by the annealing may be electrically conductive over a range of voltages used during operation of a device that contains the combined structure, may be substantially optically transparent to light emitted by the combined structure, or may be strong enough to be substantially unaffected by processing of the combined structure.

The deposition may deposit less than about 100 nm or in particular about 6 nm of material on each of the first and second structures. The deposition may deposit a low temperature grown semiconductor. More specifically, the deposition may deposit low temperature grown (Ga,As), (Ga,P), (Ga,N), (Ga,Sb), (In,As), ternary compounds such as (In,Ga,P) or (In,Ga,As), or quarternary compounds such as (In,Ga,As,P).

The method may further comprise selecting a [III]/[V] ratio of the bonding layer such that an amorphous or polycrystalline semiconductor layer is deposited on at least one of the first and second structures. In this case, the annealing of the combined structure may occur under conditions sufficient for the bonding layers to recrystallize into a polycrystalline material, which may be at most about 400° C. for As-based materials, 600° C. for P-based materials and 800° C. for N-based materials.

The bonding layer may comprise amorphous/polycrystalline (Ga,As) or other As-based semiconductors and the annealing of the combined structure occur at a temperature of between about 300° C. and 500° C. and for a time sufficient for the bonding layers to form a polycrystalline (Ga,As) or other As-based semiconductors material. Alternatively, the bonding layer may comprise amorphous/polycrystalline (Ga,P) or other P-based semiconductors and the annealing of the combined structure occur at a temperature of between about 500° C. and 700° C. and for a time sufficient for the bonding layers to recrystallize into a polycrystalline (Ga,P) or other P-based semiconductors material. The bonding layer may comprise amorphous/polycrystalline (Ga,N) or other N-based semiconductors and the annealing of the combined structure occur at a temperature of between about 700° C. and 900° C. and for a time sufficient for the bonding layers to recrystallize into a polycrystalline (Ga,N) or other N-based semiconductors material.

BRIEF DESCRIPTION OF THE DRAWINGS

FIGS. 3(a) and 3(b) are TEM pictures of amorphous/polycrystalline alternating (Ga,As) and (Al,As) layers before and after annealing.

DETAILED DESCRIPTION OF THE PRESENT EMBODIMENTS

Figure 1A:
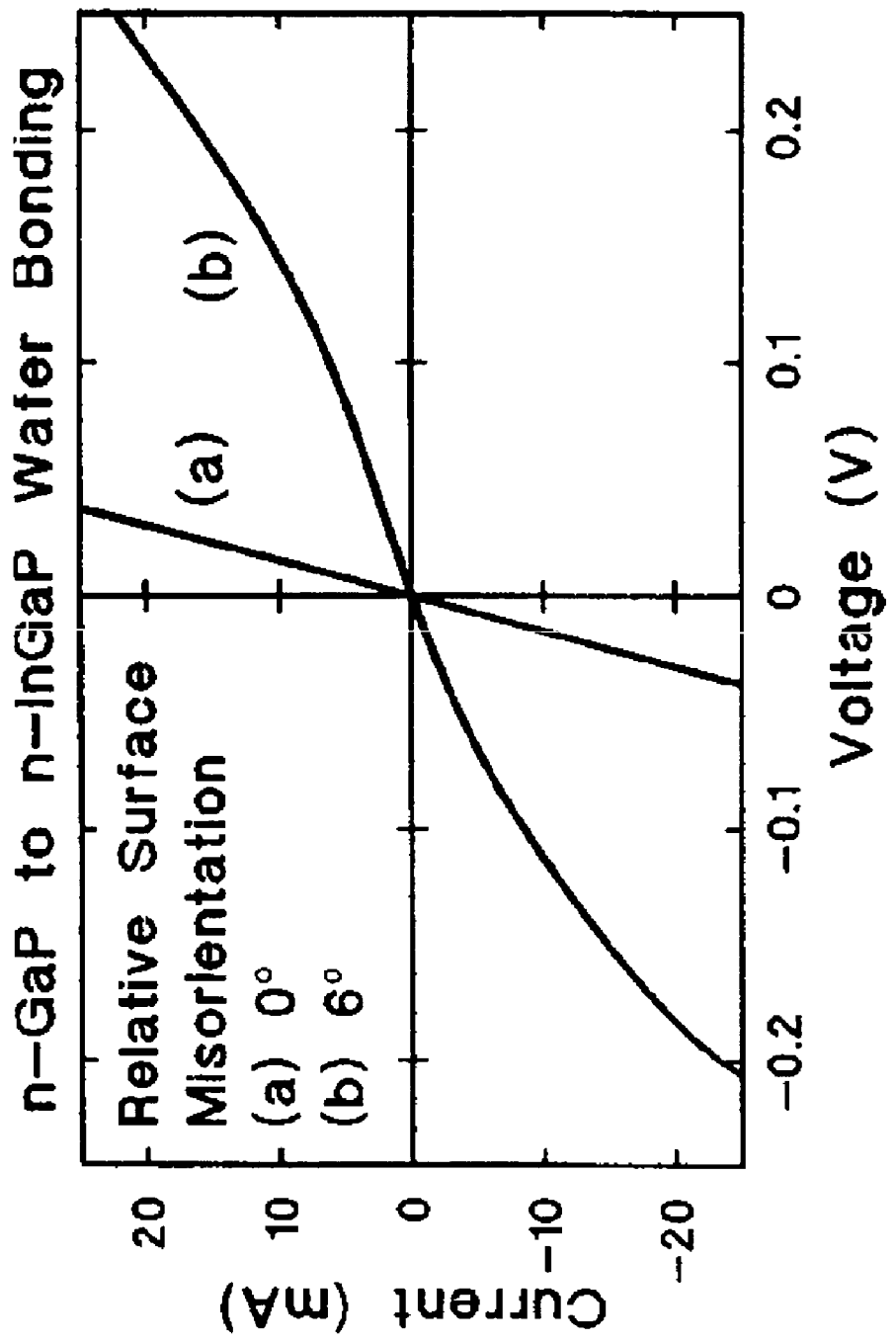
FIGS. 1(a) and 1(b) are graphs illustrating the effects of substrate orientation direct bonded wafers.
Figure 1B:
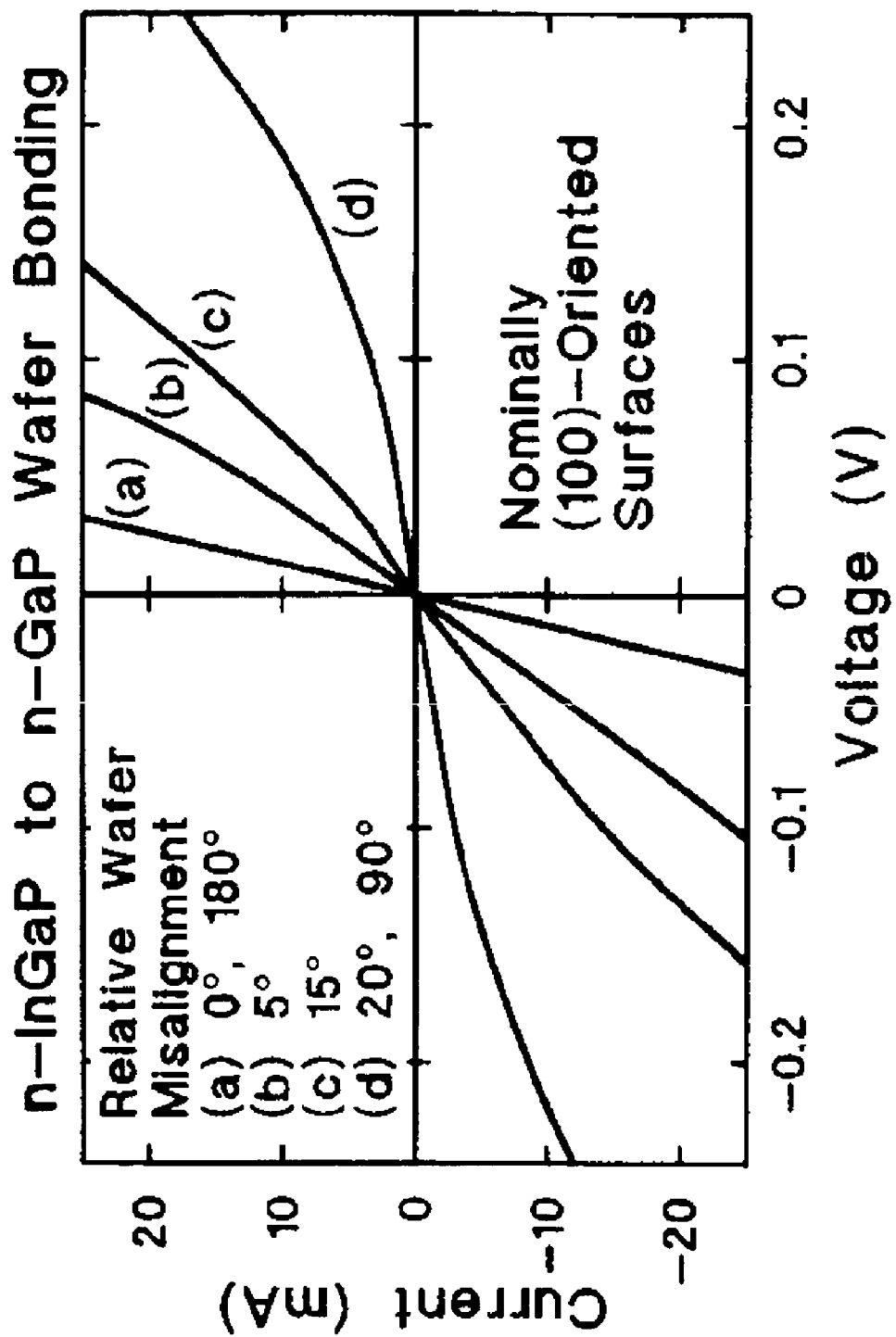

Integration of a viable bonding technology to produce different types of semiconductor devices, notably LEDs and VCSELs, is an important factor in decreasing the cost of the next generation of these light emitting devices. In addition, such a bonding technology can be used to integrate the advantageous optical properties of III-V material systems, such as InP, with the advanced technology of Si in the formation of optoelectronic integrated circuits. Moreover, this technology enables the use of semi-insulating substrates for high-speed high-power devices such as heterojunction bipolar transistors (HBTs) or high-electron-mobility transistors (HEMTs). Additionally, a combination of these technologies, in particular the bonding technology, is likely to advance the development of three-dimensional integrated circuits.

Very recently, amorphous/polycrystalline (Ga,As), (Al,As), (In,As), (Ga,P), and (Ga,N) materials were developed. Although the amorphous/polycrystalline semiconductors can be deposited on a substrate using sputtering, chemical vapor deposition, molecular beam epitaxy (MBE), or other similar techniques, the most control of the deposited structure appears to be achieved using MBE. Typical growth temperatures for normal crystalline semiconductor material are on the order of 500° C. (400° C. for InAs or some Sb-based materials) or higher when using MBE. However, polycrystalline and amorphous materials can be grown by MBE at much lower temperatures. More specifically, the conditions in growing the structures by MBE include low temperatures of about 100° C. and lower and adherence to a specific ratio of column V and column III fluxes (overpressure during growth) as the material characteristics are highly dependent on the ratio of the overpressures. This class of materials, i.e. materials that have an amorphous and/or polycrystalline structure rather than a single crystal structure, can be used to form bonds between different semiconductor layers.

One aspect of such MBE growth is that because the material is non-stoichiometric, a one-to-one ratio of the components is not required. For example, the As to Ga ratio in low temperature grown (Ga,As) can be varied to achieve desired characteristics. Further, while some of the material characteristics vary with the growth conditions and substrate, others remain essentially the same no matter what is varied. In one example, low temperature MBE grown (Ga,As) has the same crystallinity and As/Ga ratio under the same growth conditions regardless of substrate type. To the contrary, the index of refraction of low temperature grown (Ga,As) increases linearly with respect to the As/Ga ratio from that of bulk crystal despite the structure. Unlike single crystal GaAs, no clear absorption edge exists with low temperature grown (Ga,As), while at photon energies below that of the single crystal bandgap, the low temperature grown (Ga,As) exhibits much higher absorption than single crystal GaAs. Changes to the electrical characteristics include an increase in the resistivities of the materials with increasing As/Ga ratio, as well as a possible change in the majority carriers (type) of the semiconductor.

Figure 2A:
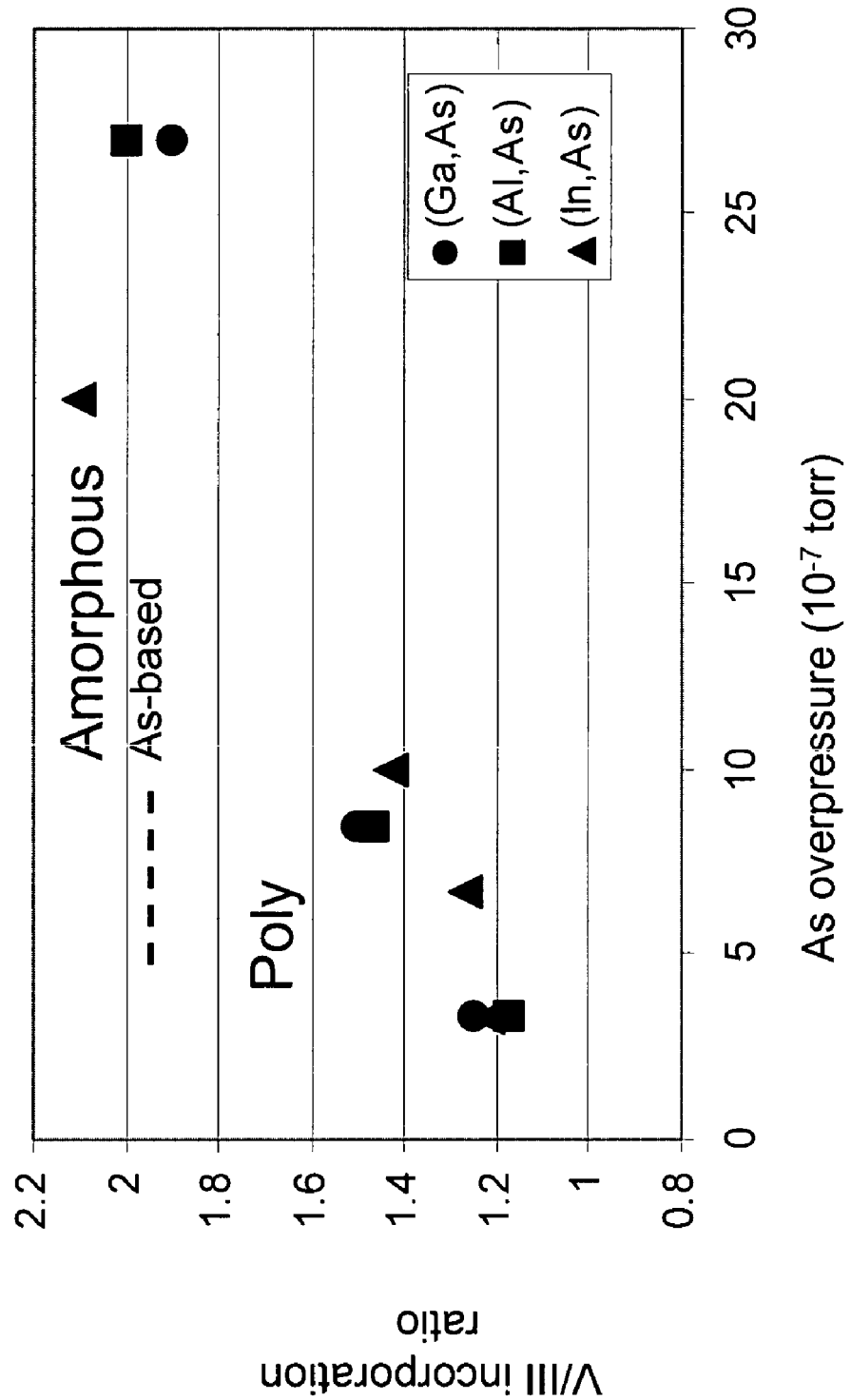
FIGS. 2(a) and 2(b) are graphs that illustrate the effect of the [V]/[III] ratio on the crystallinity.
Figure 2B:
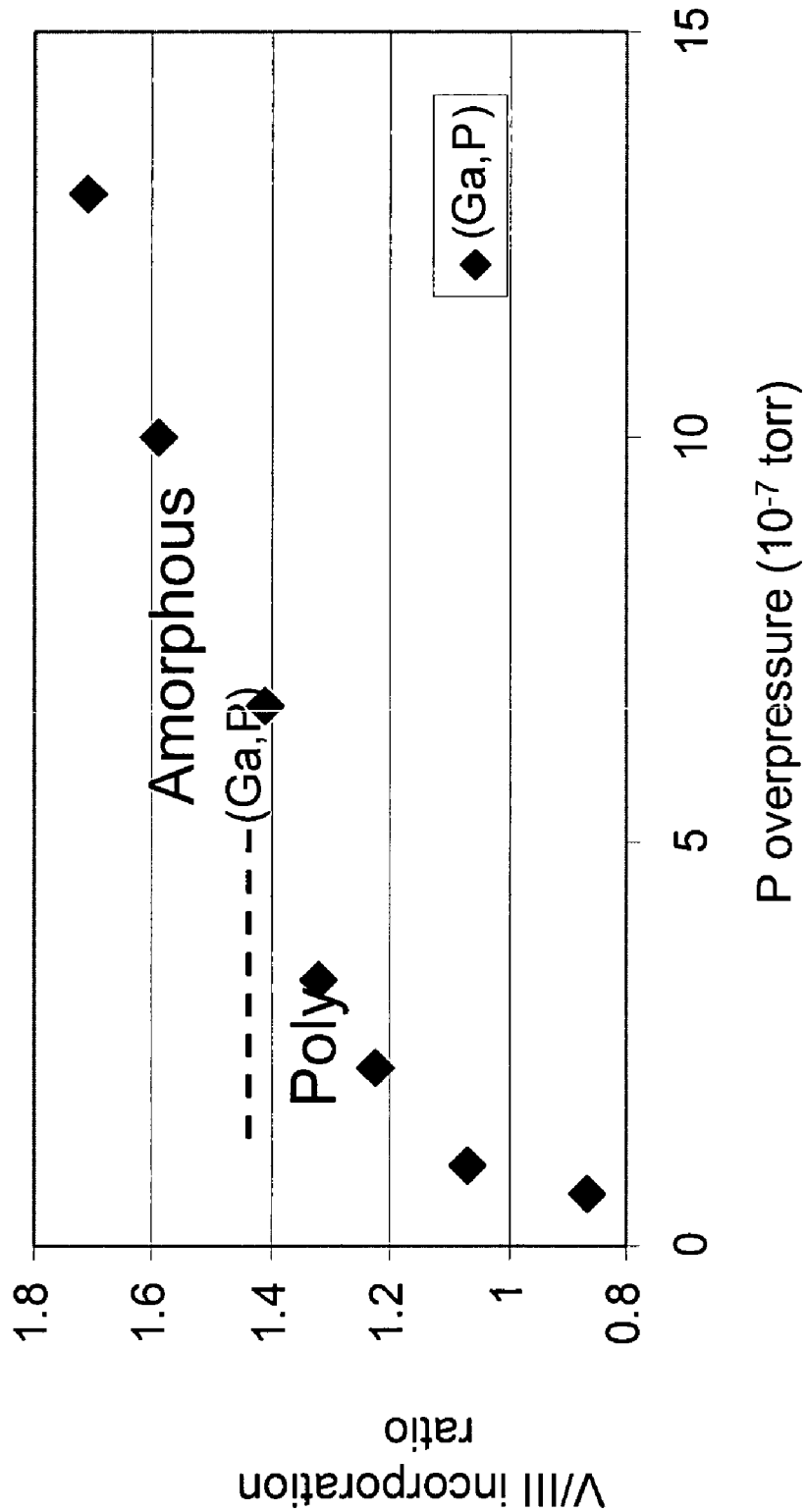

FIGS. 2(a) and 2(b) illustrate the effect of varying the component ratio on the crystallinity of the structure. As shown in FIG. 2(a), an As-based material becomes amorphous when it incorporates excess As such that the [V]/[III] ratio is greater than 1.25. Similarly, the As-based material becomes polycrystalline when the ratio is below 1.25; it does not need to be column III-rich to become polycrystalline. On the other hand, as shown in FIG. 2(b), the [V]/[III] ratio that serves as the dividing line between amorphous and polycrystalline structures for (Ga,P) based-material is very close to 1. Therefore, a Ga-rich (Ga,P) material is polycrystalline while P-rich (Ga,P) material is more likely to be amorphous.

Figure 4:
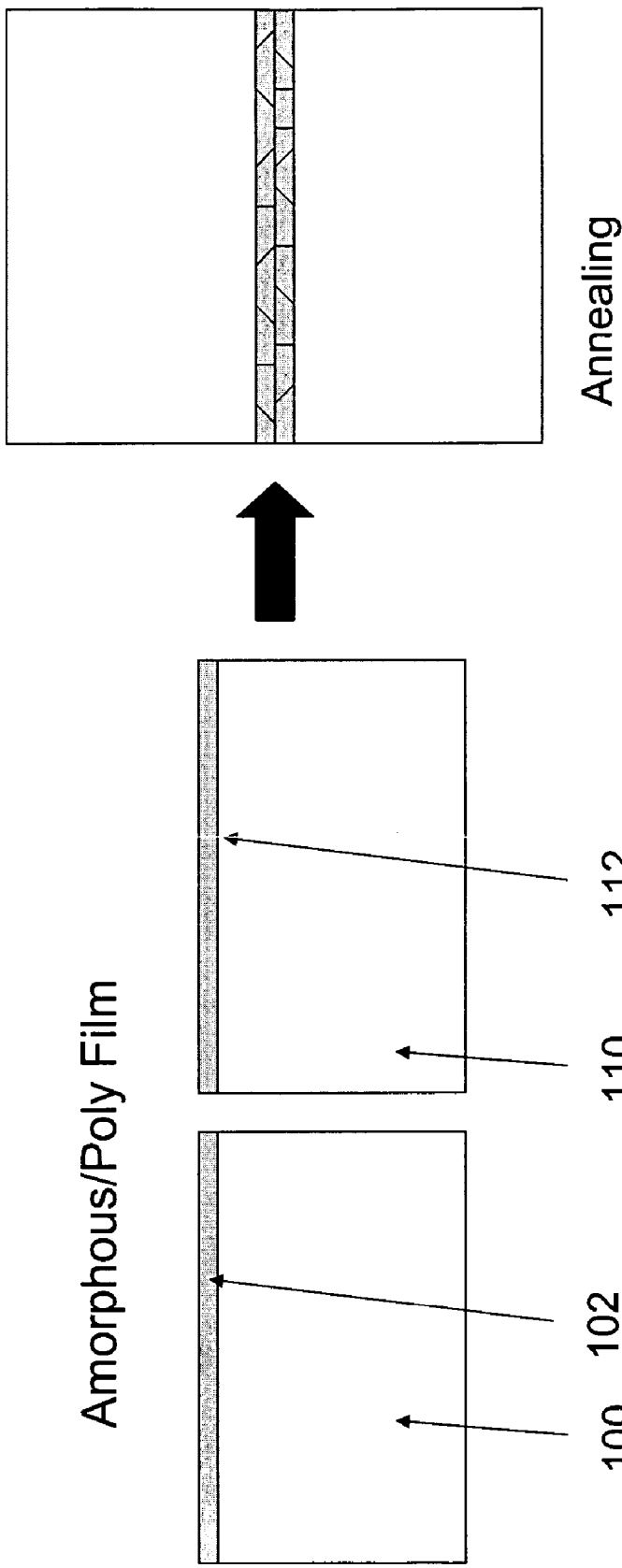
FIG. 4 is a schematic illustrating the bonding of two low temperature grown semiconductors.

Shown in FIG. 3(a) is a stack of amorphous/polycrystalline alternating (Ga,As) and (Al,As) layers. The (Ga,As) layers were deposited with a decreasing column V flux while the column III flux was fixed. The last (Ga,As) layer, which was deposited with the smallest column V flux, was polycrystalline as can be recognized from the grainy contrast in the picture. These (Ga,As) layers were sandwiched by (Al,As) layers, which were deposited with a large enough column V/III flux ratio so that they were all amorphous. During thermal annealing at 300° C., the amorphous (Ga,As) deposited with an intermediate As overpressure recrystallized into a polycrystalline form, as shown in FIG. 4(b). This annealing was performed in either an arsenic or nitrogen ambient. For low temperature annealing (less than about 300° C.), the crystallization rate is relatively slow. During crystallization, the underlying material on which the amorphous material is present generally acts as a seed so that the polycrystal grains exhibit the same crystallographic directions as the underlying material. However, as one advantage of the low temperature grown materials used is that they can be grown on any surface while still essentially maintaining their useful bonding characteristics rather than being limited to being grown on a similar single crystal material, the underlying surface may not have any crystallinity. In addition, while using low annealing temperatures renders the resulting material polycrystalline, as the annealing temperatures increase, the amorphous material may become a single crystal semiconductor and the conductivity of the resultant material may improve.

Figure 5:
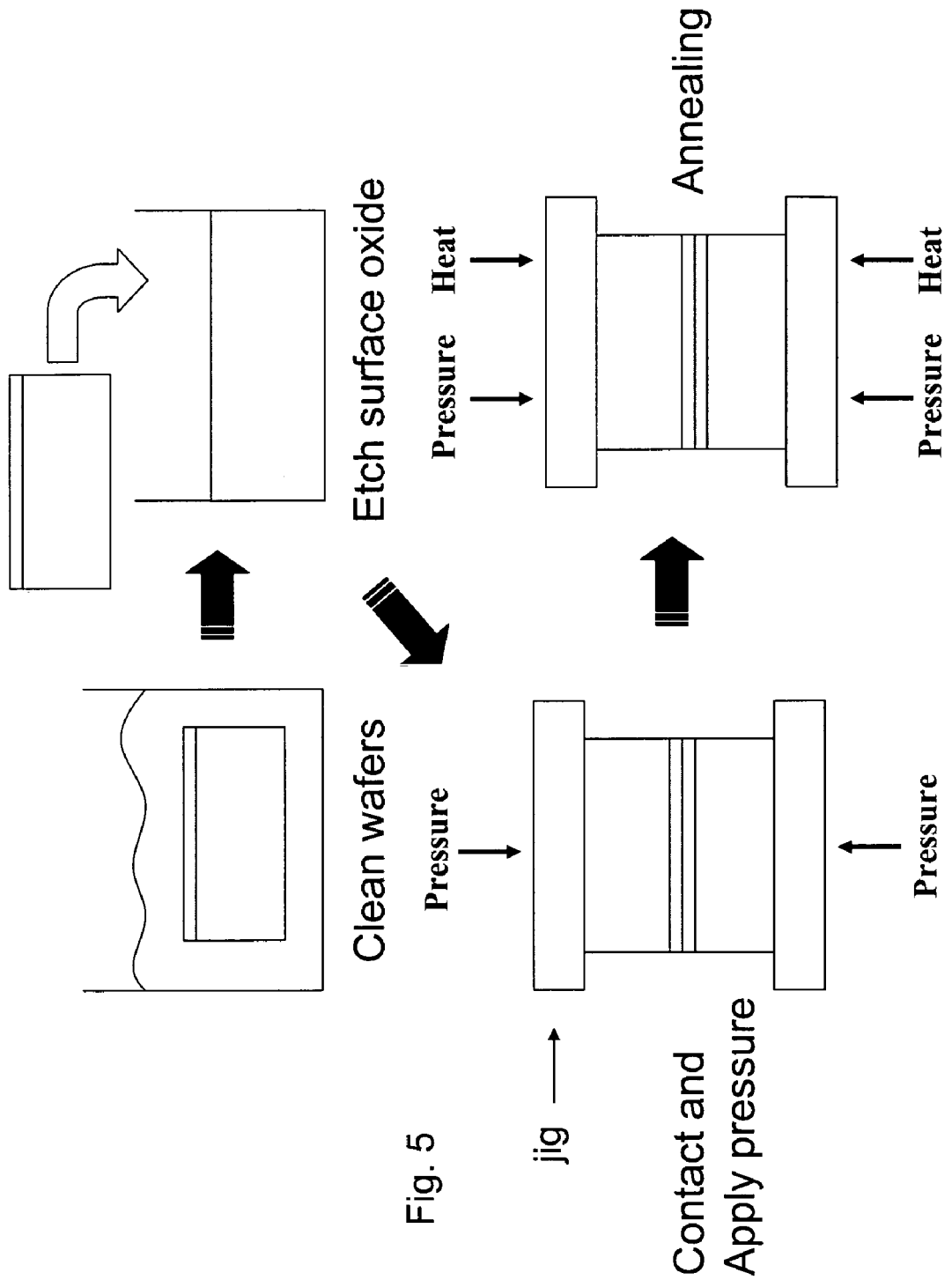
FIG. 5 is a more in depth view of the process for the bonding of various substrates using low temperature grown semiconductors.

Although studies have been performed on the annealing of amorphous compound semiconductors to form polycrystalline semiconductors, neither the resultant polycrystalline semiconductors nor the method of forming the polycrystalline semiconductors has been used in bonding. This polycrystalline material is surprisingly effective when used as a bonding layer for bonding two structures together. The movement of atoms during even low temperature annealing of the low temperature amorphous/polycrystalline materials enhances the interchange of the atoms across the bonding interface and hence permits a strong bond to be formed between the low temperature grown materials and the underlying materials on which the low temperature grown materials are deposited. This is to say that a bond is a layer that is physically strong enough to withstand the further processing used during fabrication of devices using the overall structure. A process has been developed for the bonding of various materials, most notably semiconductor substrates, using low temperature grown semiconductors that have been annealed as the bonding materials. The general process is shown schematically in FIG. 4 and a more detailed process is shown in FIG. 5.

In the process shown, two substrates 100, 110 which are to be bonded are first deposited with amorphous/polycrystalline semiconductor 102, 112 as the bonding layer in a growth chamber (not shown). One or more layers (not shown) can exist between the bonding agent 102, 112 and the substrate 100, 110. One of the structures (herein referred to as a type A structure) used to bond GaAs substrates, for example, can start with a semi-insulating (SI) GaAs substrate, followed by a growth of lattice-matched InGaP 1000 thick, a 1-μm doped (n or p) GaAs single crystal layer, and finally the amorphous bonding layer on top of the GaAs single crystal layer. A second such structure (herein referred to as a type B structure) contains a conducting n-type GaAs substrate with only the amorphous bonding layer on top of the substrate. As mentioned above, in an MBE chamber the growth temperature of the GaAs amorphous layers is about 100° C. In addition, the arsenic overpressure during growth may be varied between $5 \times 10^{-7}$ and $1 \times 10^{-6}$ Torr as measured by an ion gauge in the rear of the chamber, although these numbers can change depending on the MBE system used and the position of the ion gauge. The growth rate for the amorphous layers grown under these conditions was about ½ monolayer/second or 1.4'/s.

As above, although MBE affords the most control, the deposition technique is not critical as long as the material is amorphous as well as free of contaminants. Such contaminants do not include controlled impurities that may be added as dopants such as Si. Addition of Si, for example, helps to control the morphology of the low-temperature grown semiconductors and expand processing windows such as annealing temperature and time beyond which the microstructure disintegrates and electrical properties degrade. Other dopants, such as Be, Mg, Zn, Te, and Se, for example, may also be used for the same purpose. The substrates may be commercially available semiconductor or non-semiconductor substrates, for example, or may be grown in a growth chamber or otherwise produced specifically for the particular device to be fabricated.

Once the substrates 100, 110 are removed from the growth chamber, the structures are cleaved to the desired size (for the experiments performed thereon, the size was about 1 cm$^2$). As shown in FIG. 5, the structures were then cleaned by a combination of blowing the structure with high pressure $N_2$ to remove dust/particles/impurities, degreasing the structure using acetone, methanol, isopropyl alcohol, de-ionized (DI) water and isopropyl alcohol again to clean and remove contaminants, and submerged in different solvents and agitated in an ultrasonic agitator to remove organic contamination. The structures were then dipped in pure HCl for 5 min to remove native oxide from the surface of the semiconductor layer and subsequently rinsed in DI water and dried using $N_2$. The specific processes used during cleaning and etching may however depend on the particular substrates and materials used. In general, however, impurities and particles left on the surface of the samples may lead to defects in the bond and result in a nonuniform, and perhaps poor, bond.

Figure 6:
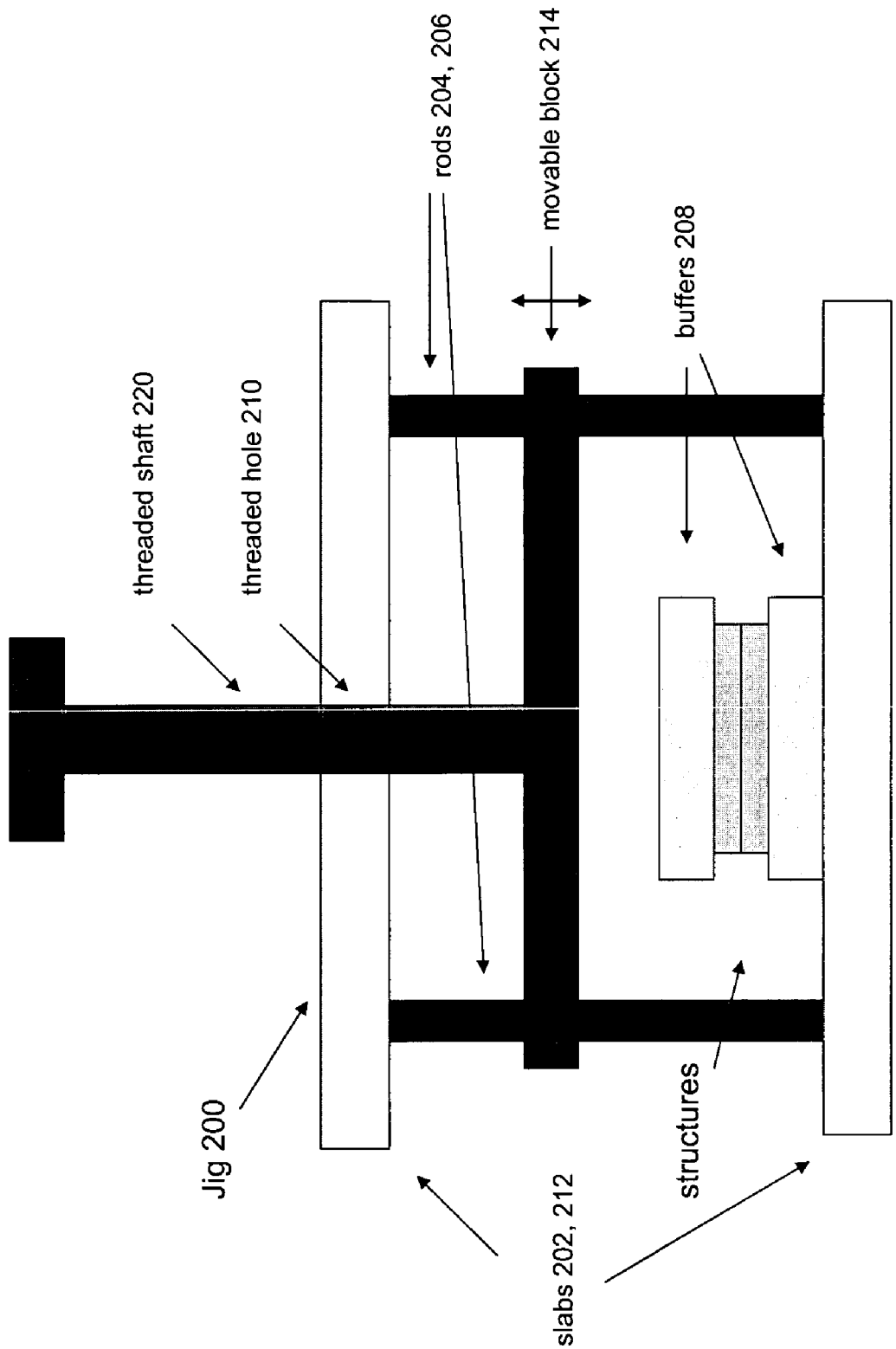
FIG. 6 shows the pressure jig with the structures before pressure is applied.

The structures are then positioned to face each other, sandwiched between two buffers 208, and pressed in a steel pressure jig 200, as shown in FIG. 6, before the entire apparatus, jig, buffers, and structures, is placed and annealed in a furnace for bonding to take place. The buffers 208 help to apply uniform pressure to the structures being bonded and/or cushion the structures during pressurization. Carbon conflat material was used as the material of each of the buffers for its durability, low cost, and flatness. If uniform pressure is not desired or the structures are strong enough, they may not have to be cleaved to fit in the jig 200 and/or the buffer 208 may be eliminated. Alternatively, a jig may be used that cushions the material while being strong enough to apply the desired amount of pressure under the predetermined annealing conditions.

In general, the pressure jig 200 contains two slabs 202, 212 that oppose each other. A separate movable block 214 is positioned between the two slabs 202, 212. Alternatively, the movable block may not be present; instead at least one of the slabs 202, 212 is vertically movable. As shown the substrates 100, 110 are placed on one of the slabs 202, 212. The movable block 214 has a threaded hole 210. A threaded shaft 220 is inserted through and engages with the threaded hole 210. The block 214 may also have a threaded hole or may be attached to the shaft 220 with adhesive, for example. The block 214 is movable by rotating the shaft 220. To help stabilize the jig 200 when moving, unthreaded rods 204, 206 are disposed on opposing ends of the slabs 202, 212 and the block 214. The rods 204, 206 are relatively smooth to enable easy traverse of the block 214 along the rods 204, 206. Of course, the rods can be disposed elsewhere along the block 214 or more (or fewer) than two rods may be used as long as the jig is adequately stabilized when the block is moving. In addition, although a screw/threaded shaft combination is shown, any other means of displacing the slabs toward or away from each other may be used, for example, consistent pressure may be applied using a bolt and a torque wrench.

Although as shown in FIG. 6, the substrates 100, 110 are attached to one of the slabs (specifically the lower slab 202), one of the substrates may be attached to the block 214 using an appropriate adhesive. This adhesive is then removed once the bonding is completed. The substrates 100, 110 are positioned such that the bonding agents on the substrates face the substrate 100, 110.

Once the substrates 100, 110 are placed on the jig 200 and pressed against each other, the substrates 100, 110 are annealed in a furnace to bond the substrates 100, 110 to each other through the bonding materials 102, 112, as shown in FIG. 5. In at least some of the experiments described herein, a pressure was applied with a torque between 12 and 20 in-lb. Bonding was performed by heating the wafers in $N_2$ ambient in an open-tube furnace. The bonding temperature used ranges from about 300° C. to 800° C. depending on the type of bonding materials, although somewhat higher temperatures may also possibly be used. Bonding with amorphous/polycrystalline (Ga,As), (Ga,P) and (Ga,N) material was performed at different temperatures: for As-based bonding materials bonding was performed at a relatively low bonding temperature of about 400° C.; for P-based bonding materials, a higher temperature of about 600° C. was used; and for N-based bonding materials, an even higher temperature of about 800° C. was used. The structures remained pressed together throughout the course of the annealing. While the annealing times can be as long as 10 hours, times as short as 30 minutes have been found to be sufficient to ensure a strong bond as a combination of the material to be annealed and annealing temperature and time determines the bond strength. Also, the structure may be annealed in air ambient or other ambients such as nitrogen or hydrogen. Thus, two face-to-face amorphous layers crystallize and form a bond across the two samples when the samples are pressed together and annealed.

Figure 7:
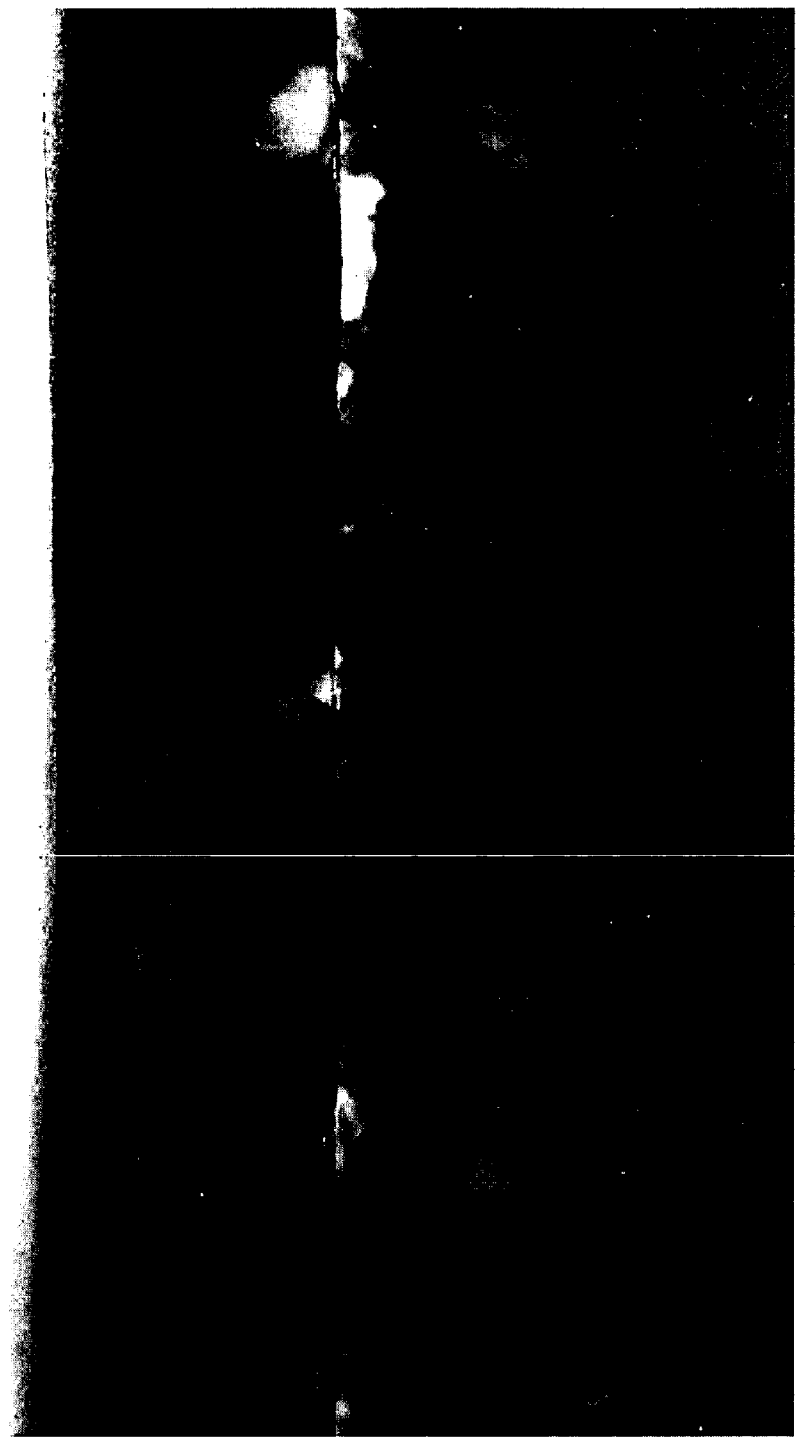
FIG. 7 is a TEM picture of GaAs substrates bonded with amorphous (Ga,As) at 400° C. for 60 minutes.

A typical interface structure is shown in FIG. 7 for two GaAs substrates bonded with amorphous (Ga,As) at 400° C. for 60 minutes. Under these conditions, the initially amorphous (Ga,As) recrystallized to become polycrystalline (Ga,As) during the bonding/annealing process. A similar microstructure but without a clear presence of the solid-state epitaxy appears when polycrystalline (Ga,As) is used as the bonding material rather than the amorphous (Ga,As) material. The two dashed lines in the TEM photograph of FIG. 7 indicate the boundaries between the substrates and the low temperature grown amorphous (Ga,As) material before the low temperature bonding process is performed.

Similarly, bonding with amorphous and polycrystalline low temperature grown (Ga,P) or (Ga,N) material is essentially the same as that using the (Ga,As) material, again illustrated in FIG. 5. The (Ga,P) or (Ga,N) material is first deposited onto the substrate to be bonded. Again, the deposition technique is not important as long as the material is substantially free of contaminants (rather than, perhaps, dopants) and the ratio of gallium to phosphorous or nitrogen in the low temperature grown (Ga,P) or (Ga,N) materials can be varied respectively. The structures may be cleaved to appropriate sizes for the jig. The surface of both structures is then cleaned using solvents, oxides on the surface of the (Ga,P) are removed and the structures are then rinsed and dried. As above, the structures are pressed together and annealed. The structures remain pressed together throughout the course of the annealing.

As above, the annealing temperature used for annealing the (Ga,P) material was 600° C. while for the (Ga,N) material was 800° C., both which are higher than that used for annealing the amorphous (Ga,As) material. Of course, use of higher temperatures is possible although at a certain temperature the amorphous materials may be transformed into essentially a single crystal material. Also, longer annealing times have been used for (Ga,P) material than for (Ga,As) material. These annealing times for the (Ga,P) material varied from 90 minutes to as long as 10 hours. While longer annealing times tend to increase the strength of the bonding when annealing is performed at similar temperatures, the strength of the bond need only be sufficient for further processing and typical device usage.

Figure 8B:
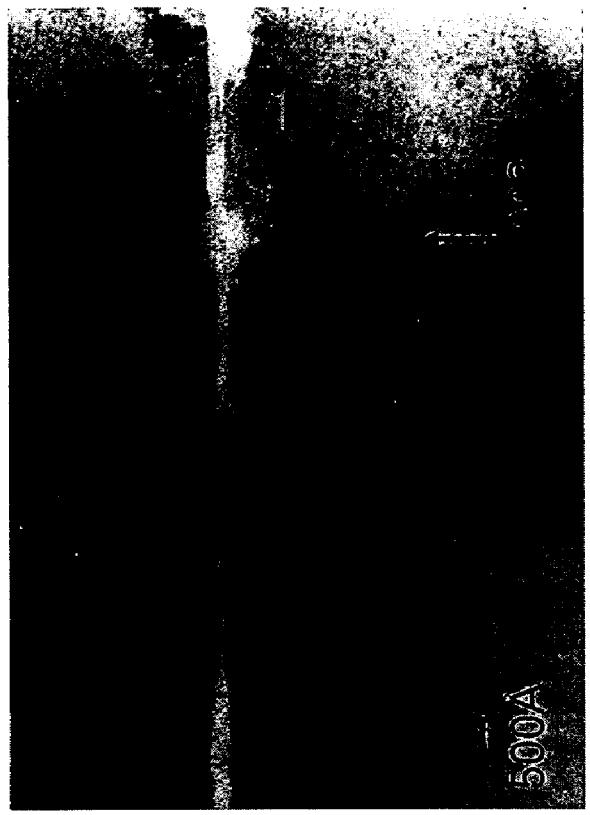
FIGS. 8(a) and 8(b) are TEM images of GaP substrates bonded with either amorphous or polycrystalline (Ga,P) at 600° C. for 9-10 hours.
Figure 8A:
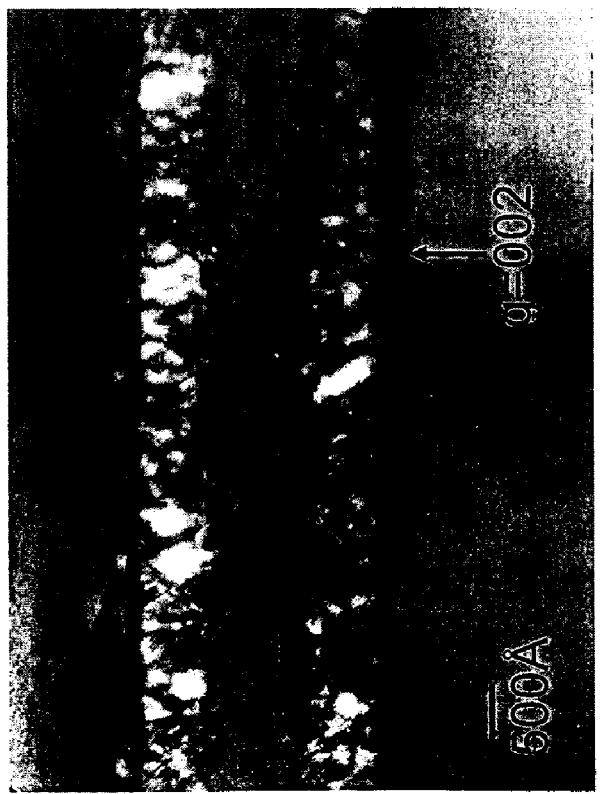

Typical interface structures are shown in FIGS. 8(a) and 8(b) for two GaP substrates bonded with either amorphous or polycrystalline (Ga,P) at 600° C. for 9-10 hours. The polycrystalline (Ga,P) bonding layer deposited on the GaP substrates was initially 1000 Å in thickness. After the substrates with the bonding layers were bonded at 600° C., as shown in FIG. 8(*a*), a portion of the top part of the (Ga,P) layer became amorphous. Thus, as illustrated, an amorphous (Ga,P) bonding layer is sandwiched between two adjacent polycrystalline (Ga,P) layers. The transformation of polycrystalline (Ga,P) crystals to amorphous (Ga,P) may be attributable to the combination of bonding pressure and temperatures used. From FIG. 8(*a*), a remainder of the polycrystalline (Ga,P) layers retain their crystallinity without undergoing any noticeable changes in crystallization at this temperature.

As shown in FIG. 8(*b*) however, it is clear that recrystallization has occurred for the amorphous (Ga,P). In this figure, a 500 Å amorphous (Ga,P) layer was deposited on each GaP substrate and used to bond the substrates together. As seen, most of the initially amorphous (Ga,P) material has transformed into polycrystalline material during the annealing. Only a very thin but uneven amorphous layer remains between the bonding layers. The thin and uneven amorphous material may be leftover residue of the initial amorphous layer or a result of amorphization under pressure, similar to that in FIG. 8(*a*). Regardless of the whether amorphous or polycrystalline (Ga,P) is used as a bonding agent for GaP substrates, a bonding strength is exhibited that is strong enough to withstand rigorous post-bonding processing and later use in applications.

For the above, the (Ga,P) layers were grown on separate n-type GaP substrates by solid-source MBE. The GaP substrate was first desorbed at 630 to 640° C. and a 1000 Å GaP buffer layer was deposited. The substrate was cooled down to about 100° C. before a 500 Å amorphous or 1000 Å polycrystalline (Ga,P) layer was deposited at phosphorous overpressure of $2 \times 10^{-7}$ or $6.5 \times 10^{-8}$ Torr, respectively. As shown in the TEM pictures above, during annealing the low temperature grown layer recrystallized and the atoms diffused across each sample to bond the two substrates.

Figure 9:
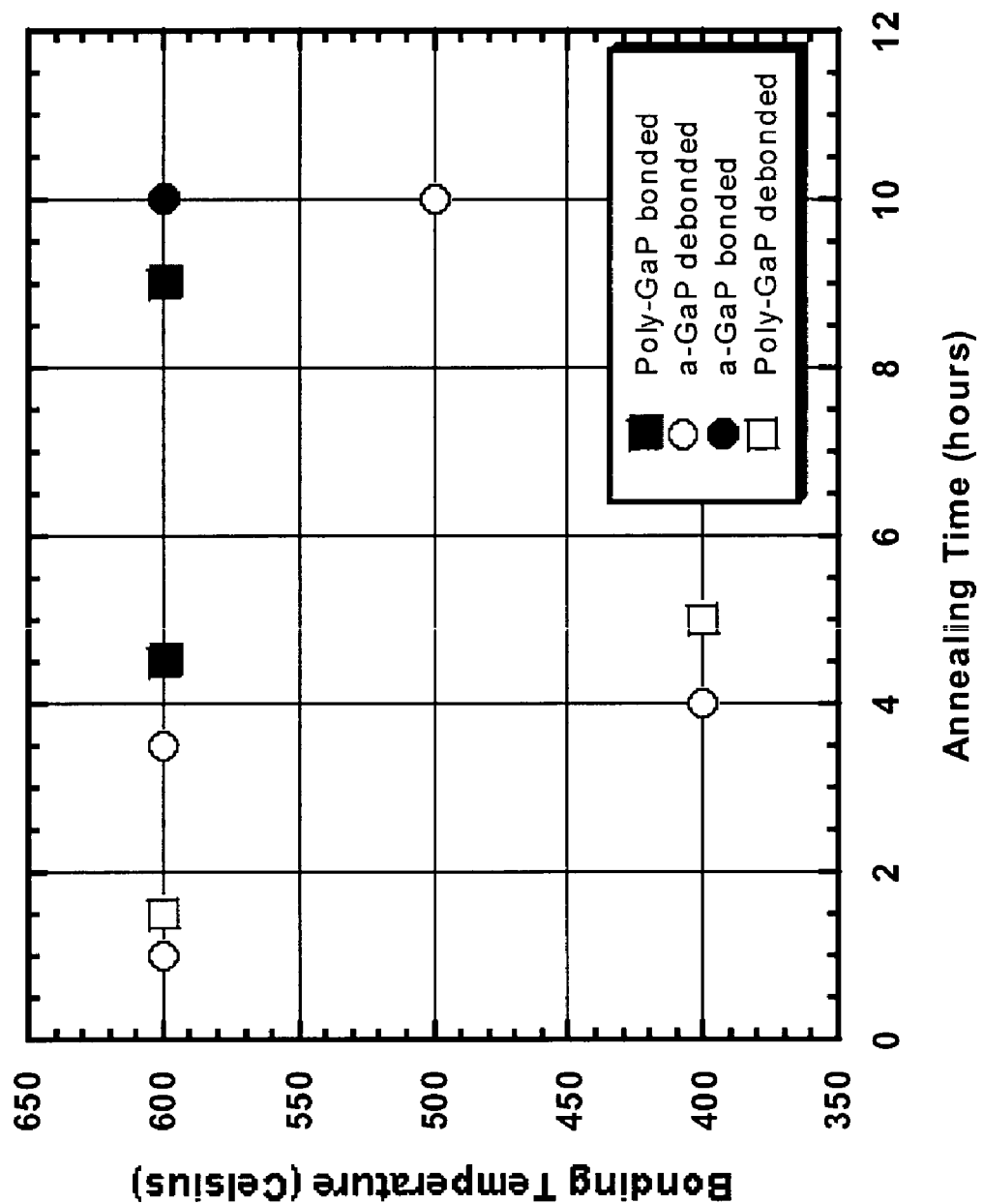
FIG. 9 is a graph of annealing times and temperatures for bonding with low-temperature grown (Ga,P) materials.

Various annealing temperatures and times were used for bonding. These conditions varied from 400° C. to 600° C. and ranged from 1 to 10 hours. FIG. 9 shows the bonding results for different low-temperature grown (Ga,P) materials. All samples were bonded and intact when removed from the jig. They were cut in smaller pieces and processed for TEM samples. Some of them failed and became debonded (open circles or squares) during TEM sample preparation. Samples became debonded if the annealing temperature was below about 600° C., no matter if the bonding agent was amorphous or polycrystalline (Ga,P) material. Such a low annealing temperature may be too low to activate atoms to interchange from one wafer to the other wafer. Once the annealing temperature is raised above about 600° C., however, a strong bond is formed. In this case, the amorphous (Ga,P) required longer annealing time than polycrystalline (Ga,P) to form a strong bond, perhaps taking more time to recrystallize and interchange atoms for bonding to take place. After annealing, the polycrystalline (Ga,P) bonding interface may have some dense solid Ga particles in the interface region, which may reduce the light transmission as discussed below.

Figure 10:
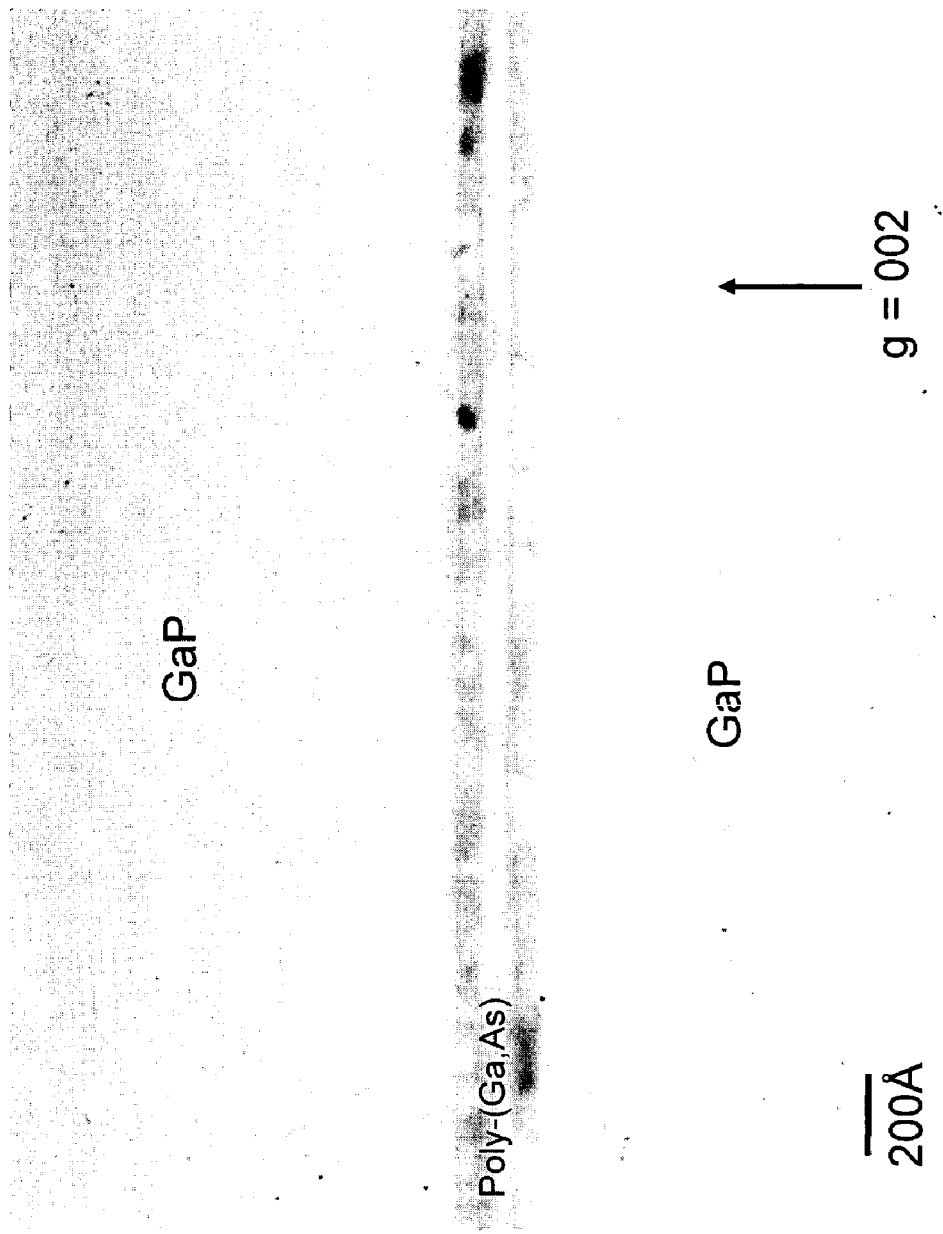
FIG. 10 is a dark field TEM image showing two GaP substrates bonded with polycrystalline (Ga,As).

Different types of semiconductor may also be used to bond substrates. For example, rather than amorphous and polycrystalline (Ga,P) being used as a bonding agent on GaP substrates, (Ga,As) layers may be used. Annealing conditions of 400° C. for 1 h for amorphous (Ga,As) used as a bonding agent yields sufficient bonding strength for further processing while decreasing the annealing temperature and processing time for wafer bonding. In comparison with the (Ga,P) layers on the GaP substrates, solid-state epitaxy was noticed near the base of the amorphous (Ga,As) layers; that is, the recrystallized film followed the crystal direction of the substrate and became a single crystal. The top of amorphous layer became polycrystalline during annealing to help bond two wafers together. For annealed polycrystalline (Ga,As) layers of 100 Å thickness, no significant solid-state epitaxy existed at the interface, probably due to the polycrystalline nature of (Ga, As) material and the difficulty in arranging atoms to form single crystal epitaxy following the crystal direction of the substrate. In addition, solid-state epitaxy was not observed in the dark field TEM image of GaP substrates bonded with polycrystalline (Ga,As), shown in FIG. 10.

Other structural properties include bond strength, which has been repeatedly mentioned. One manner of testing the bond strength is relatively low tech: a "tape test". After two wafers were bonded and removed from the jig, a piece of over-sized Scotch™ tape was placed on each side of the bonded structure and the two tape pieces were allowed to adhere to each other. The tape pieces were then peeled open. If the adhesion between the tape and structure was stronger than the bond strength, the structure was peeled open. If the bond strength was stronger, the structure remained sealed, a good indication that the structure is strong enough to withstand post-bonding processing and use. In addition, the strength of the bonded structures was further tested during preparation for TEM measurements. The structures were diced into small pieces by a dicing saw and then lapped using aluminum oxide powder. This rather demanding process was a further indicator of the bond strength, if delamination of the bonded wafer did not occur.

Figure 11A:
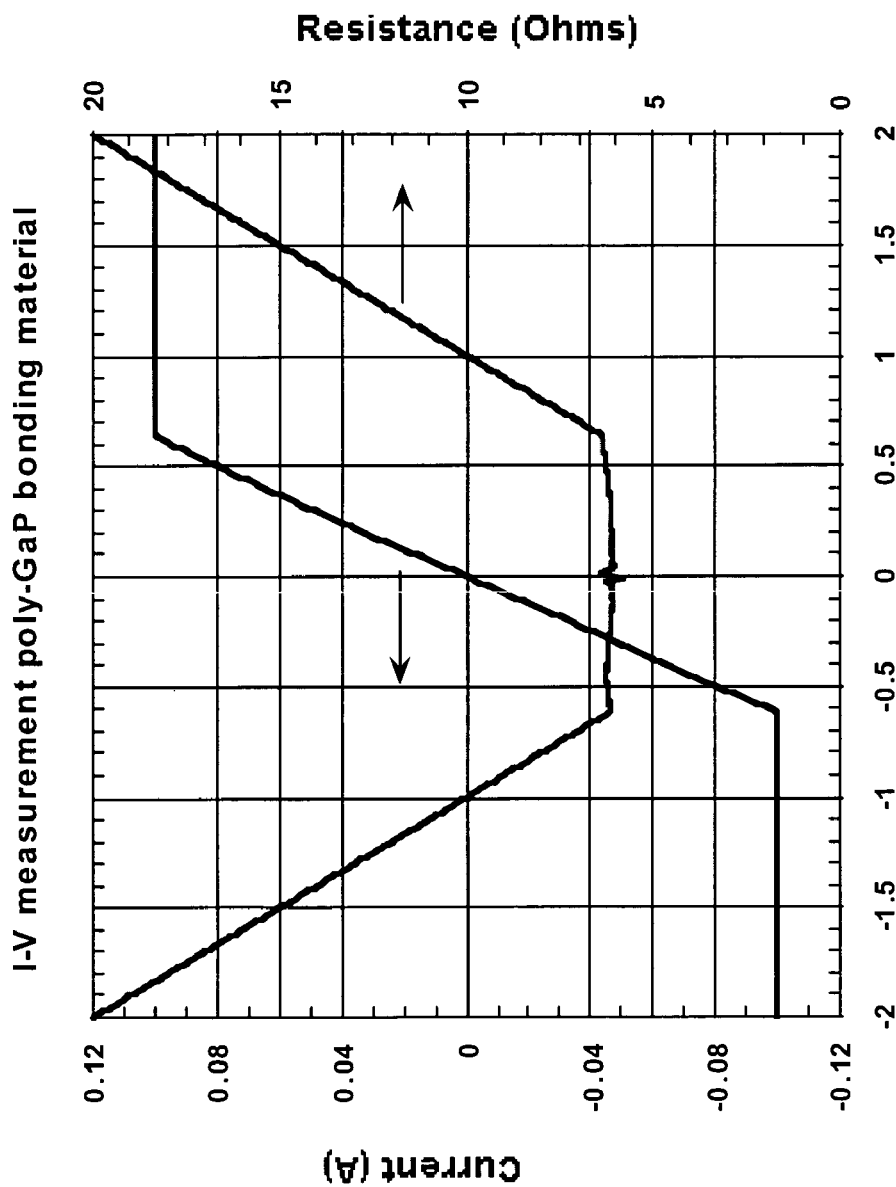
FIGS. 11(a) and 11(b) are graphs of the I-V characteristics of GaP substrates bonded with a Ga-rich polycrystalline (Ga,P) and P-rich amorphous (Ga,P).
Figure 11B:
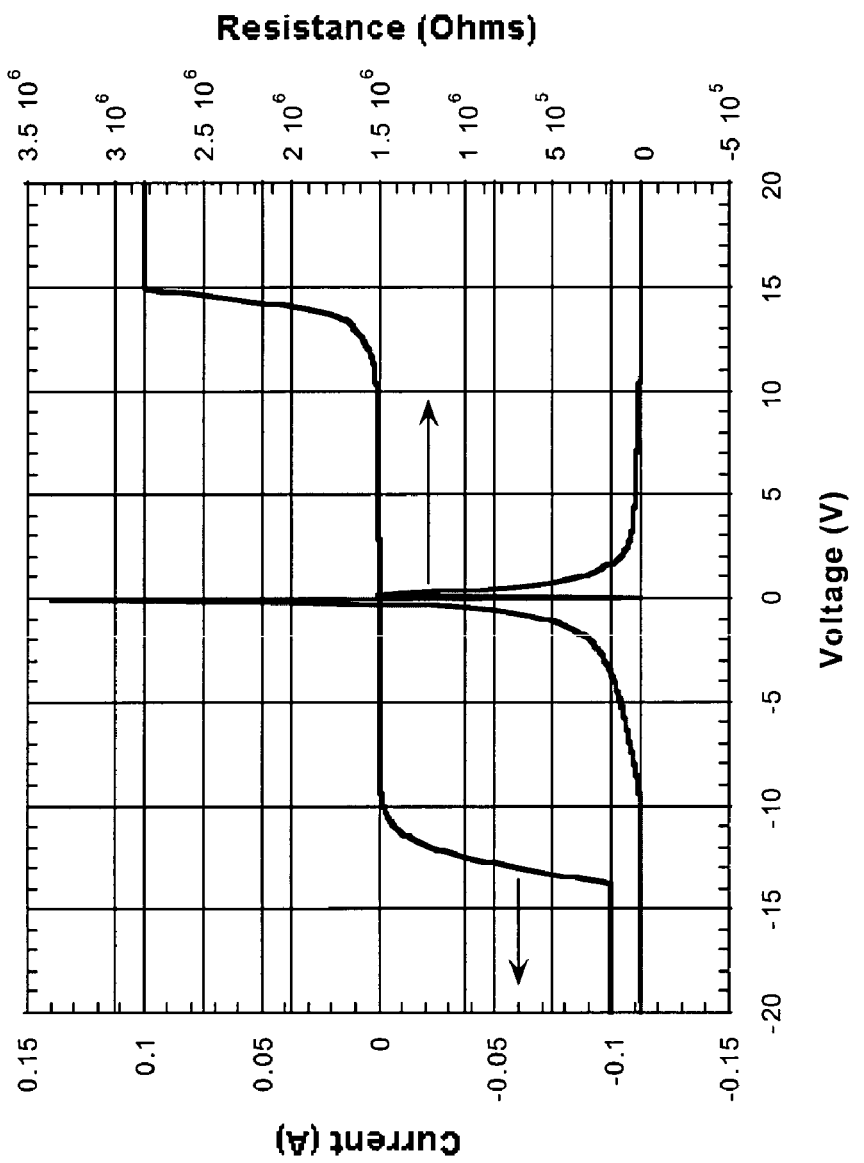

The electrical properties of the bonded substrates were also examined. One manner of determining the electrical conductivity across the interface between two GaP bonded with polycrystalline (Ga,P) is to use current-voltage measurements of the bonded substrates. FIGS. 11(*a*) and 11(*b*) are graphs of the current-voltage (I-V) characteristics of n-type GaP substrates bonded with Ga-rich polycrystalline (Ga,P) and P-rich amorphous (Ga,P) material, respectively. Each GaP substrate of the bonded structure was n-type with a doping of about $2 \times 10^{18}/cm^3$. Contacts were made to the back of each GaP substrate using Au Ge ohmic contacts. The linear dependence of the I-V measurements shown in FIG. 11(*a*) indicates that the bonding interface is ohmic when polycrystalline (Ga,P) material is used as the bonding agent, with the measured resistance between 6 and 7Ω.

In contrast, as shown in FIG. 11(*b*), a highly resistive bonding interface forms when amorphous (Ga,P) material is used as the bonding agent. As can be seen, the current is negligible until reverse breakdown, which occurs at voltages larger than 12 volts. At small applied voltages, the resistance across the bonding interface is several orders of magnitude higher than that measured in FIG. 11(*a*). The recrystallized (Ga,P) layer acts as an intrinsic semiconductor. In this case, carriers are trapped by the high density of defects, such as stacking faults and grain boundaries, resulting in low current until breakdown takes place, as illustrated.

The ohmic bonding interface resulting from the use of polycrystalline (Ga,P) material as the bonding agent is attributable to the excess Ga atoms in this material. Looking back to the dependence of the structure on the [V]/[III] ratio shown in FIG. 2(*b*), it is clear that polycrystalline (Ga,P) is Ga-rich while amorphous (Ga,P) is P-rich. During the annealing at 600° C. that creates the bond, excess Ga atoms diffuse and segregate into Ga clusters at the bonding interface connecting the two n-type GaP substrates.

Figure 12:
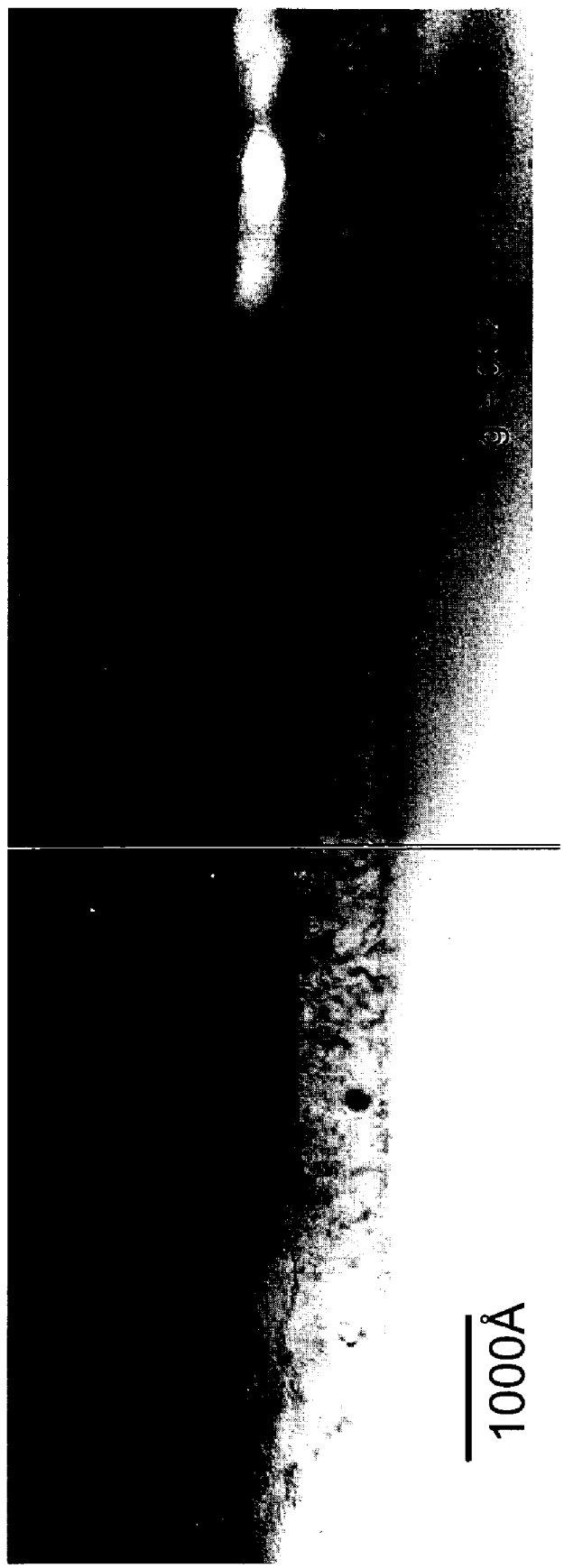
FIG. 12 is a bright field TEM image showing the bonding interface of polycrystalline (Ga,P) bonding GaP substrates.

This is confirmed in FIG. 12, a bright field TEM micrograph showing the presence of Ga-rich clusters along the bonding interface between two GaP substrates bonded at 600° C. with polycrystalline (Ga,P) as the bonding agent.

Although not shown by this figure, very Ga-rich polycrystalline (Ga,As) that is used as a bonding layer for GaP substrates has comparable ohmic characteristics. The ohmicity of the polycrystalline bonding interface is thus attributable to the presence of multiple such Ga-rich regions. Experiments have indicated that while some resistance remains in these bonding agents, the resistance (and thus amount of power required) of the bonding interface is much lower than that of bonding interfaces formed by conventional processes having substantial misalignment.

As formation of nanoscale Ga clusters sandwiched between polycrystalline layers control the ohmicity of the bonding interface, the bonding interface can be adjusted to be highly resistive or highly conductive by controlling the stoichiometry of the bonding material to be column V rich or column III rich, respectively. Since neither polycrystals nor the Ga clusters exhibit any preferred orientation, the relative misorientation between the two structures underlying the bonding layers becomes immaterial with respect to the polycrystalline layers. As a result, the linear current-voltage dependence and interface resistance is independent to the degree of misorientation or misalignment between the two substrates to be bonded. This means that the stringent requirement on wafer alignment before and during bonding, which is essential for conventional processes, is relaxed when bonding using low temperature grown materials. This, in turn, increases the processing yield. One definition of an electrically conductive structure is a structure that is substantially ohmic over substantially the range of voltages that would be applied to the bonded structure to operate the device that contains the bonded structure. To be substantially ohmic, the deviation from linearity may be less than about 10%. Similarly, substantially all of the range of voltages may be more than about 90% of the range of voltages. The resistance of the bonding layer can be set to a particular value, dependent on the overall resistance desired for the bonded structure.

Figure 13:
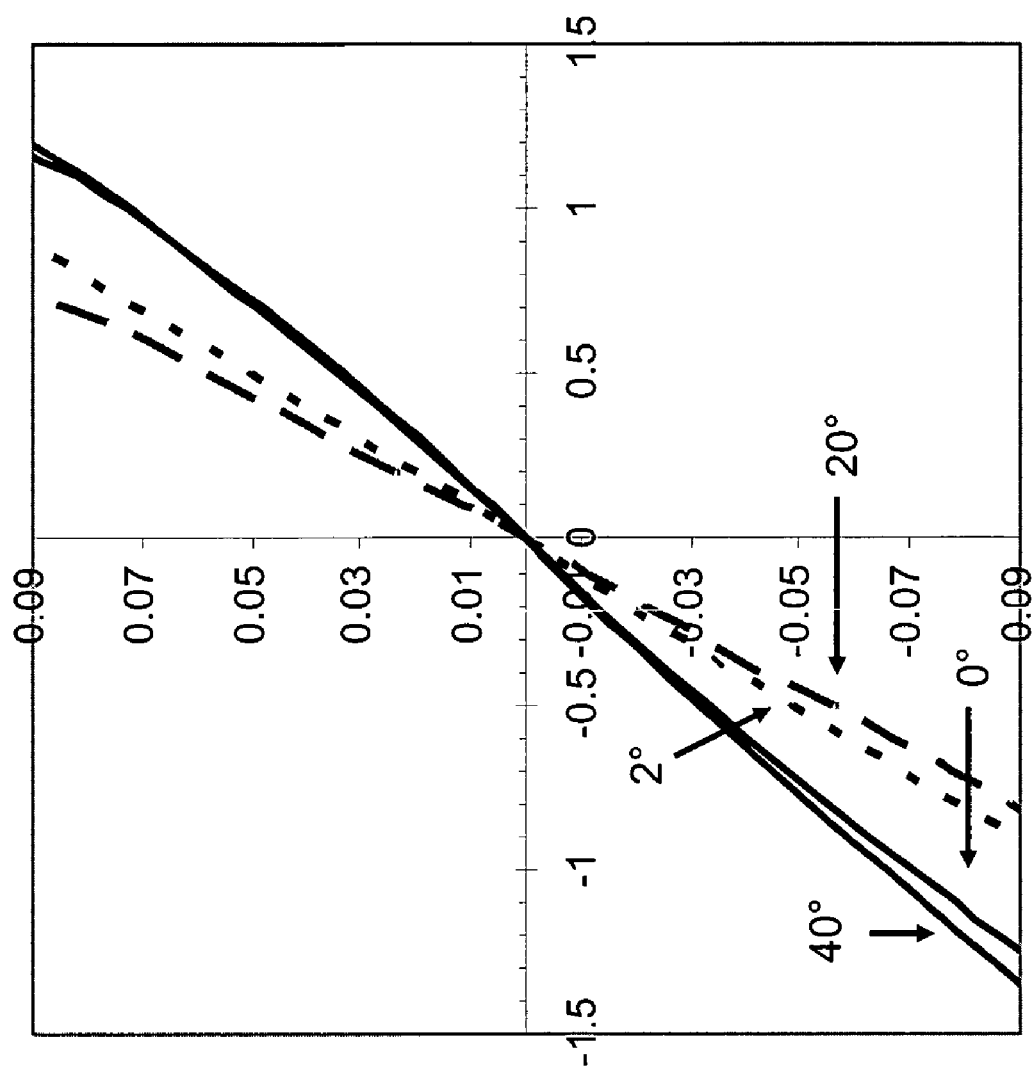
FIG. 13 shows the I-V characteristics as a function of substrate misalignment when using a polycrystalline (Ga,As) as the bonding agent.
Figure 14:
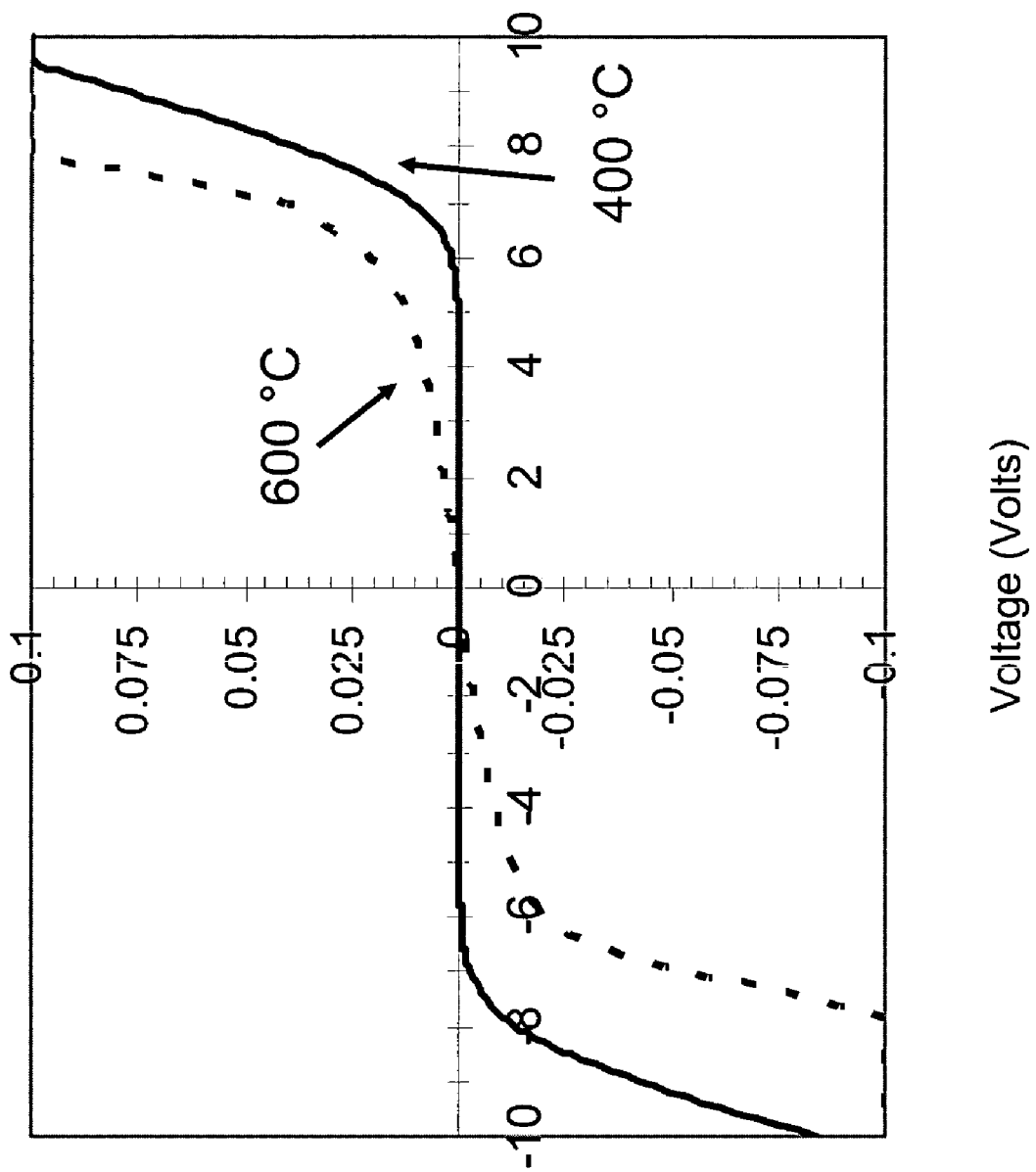
FIG. 14 shows the I-V characteristics of GaP substrates bonded at 400° C. and 600° C. with 100 Å polycrystalline (Ga,As) layer.

Two I-V characteristics are shown in FIGS. 13 and 14. In low temperature grown polycrystalline (Ga,As), more current passes through the bonding interface with an increasing amount of Ga. Furthermore, all of the bonded structures show ohmic behavior independent of the misalignment angle between the substrates, as illustrated in FIG. 13. This shows that ohmic I-V characteristics may be achieved with a very Ga-rich (Ga,As) film as the bonding agent while permitting free rotation of the underlying layers. In comparison, FIG. 14 shows that the I-V characteristics of n-type GaP structures bonded at 400° C. and 600° C. for the same duration with 100 Å polycrystalline (Ga,As) layer remains Schottky-like. Thus, the ohmic I-V characteristics may be determined by the V/III ratio in the bonding agents as opposed to bonding temperatures or time.

A Ga contact may also be used to contact n-type GaP. Although not included, the I-V characteristics of Ga on an n-type GaP substrate indicate that ohmic characteristics may be reached when annealing above 300° C. for reasonable duration (e.g. at 350° C., 30 s or less is sufficient). Wafer bonding uses annealing temperatures that are larger than this, e.g. about 600° C. for (Ga,P) materials, for polycrystalline (Ga,P), so that Ga clusters at the interface and along the grain boundaries to help the current conduction and provide ohmic I-V characteristics.

As above, bonding with amorphous/polycrystalline (Ga,N) is also possible. In one embodiment, a GaN single crystal layer of about 1 μm is grown on a sapphire ($Al_2O_3$) substrate at 750° C. before it is cooled to room temperature to grow the room-temperature (Ga,N). The room temperature GaN semiconductor may be amorphous or fine-grain polycrystalline. A low-temperature (Ga,N) layer of around 70 nm thick was then grown. Thinner bonding layers may also be grown and provide bonding characteristics (such as strength) sufficient for processing and usage, as above. Two such low temperature grown (Ga,N)/GaN/$Al_2O_3$ structures were then cleaned and bonded face to face at 800° C. for 1 hour in a manner similar to that above. As the room temperature grown (Ga,N) is likely to be substantially transparent to blue light (i.e. having an absorption coefficient such that the light passing through the (Ga,N) layer is not substantially absorbed), either thin (Ga,P) or (Ga,N) may be used for bonding applications involving blue light, such as LEDs, lasers, or detectors.

As discussed above, direct wafer bonding is an important enabling technology to achieve system-on-chip integration for advanced electronic/optoelectronic applications. Some examples of devices in which direct wafer bonding is used include InGaAs/Si photodiodes, InAs/AlSb/GaSb HBTs on sapphire, SiGe HBTs on silicon-on-insulator, and GaAs/AlGaAs/GaN HBTs. For these electronic devices, adhesive bonding with low temperature III-V semiconductors is a viable and extremely useful substitute for direct wafer bonding and greatly enhances the controllability of ohmicity across the bonding interface.

Other electronic devices, which traditionally have not used direct wafer bonding, can also profit from adhesive bonding with low temperature III-V semiconductors. Examples of these devices include high-speed electronic devices on a semi-insulating substrate such as high-electron-mobility transistors (HEMTs) as well as HBTs. While such devices have moved from being GaAs-based to being InP-based for reasons including favorable mobility and band offset, the next generation of high speed devices may be Sb-based. However, the inherent small bandgap energy of most Sb-based III-V compound semiconductor imposes challenging issues; the small bandgap energy leads to the formidable problems of high leakage and low breakdown partly due to the lack of an adequate semi-insulating substrate. More serious research on developing Sb-based high speed electronics can begin once a semi-insulating substrate for growing GaSb and other Sb-based III-V compound can be established.

One of the approaches to realize a semi-insulating substrate is to use bonding to create a template on a semi-insulating carrier. Semi-insulating InP, GaAs or even insulating sapphire are good choices for the carrier material. A schematic of creation of such templates is similar to the process to be described later and illustrated in FIG. 17. In the current process, however, a thin GaSb or other pseudomorphic structure is deposited on one or more conventional GaSb substrates. This thin pseudomorphic structure is to be used as a template for future growth. In between the thin GaSb structure and the GaSb substrate, an etch stop layer may also be deposited. Next, a thin layer of low temperature grown III-V semiconductor is deposited on the template layer. Another thin layer of low temperature grown III-V semiconductor is also deposited on a separate semi-insulating substrate such as InP, GaAs or sapphire. The formation of the low temperature grown III-V semiconductor on the separate semi-insulating substrate or insulator can be done either in the same step or in a separate reactor from that of the formation on the template layer. After this, the GaSb substrate and semi-insulating substrate are removed from the reactor, cleaved, cleaned, and etched, as described previously. These substrates are then brought together and bonded using the earlier described technique. Further processing can be applied to remove the GaSb substrate and selectively etch off the etch stop layer leaving a template suitable for growing high-speed electronic device structures. The low temperature adhesive bonding process allows strong bonding to be made at low temperatures to create the template-on-semi-insulating substrate while inducing negligible thermal damage and/or structural alterations to the template compared to the conventional direct wafer bonding technique.

For electronic devices such as HEMTs and HBTs, electrical conductivity is a concern but optical transparency is not particularly important. Many advanced applications, however, require that the bonding interface be both electrically conductive and optically transparent. For optoelectronic devices in particular, the optical transparency of the bonding interface becomes significant, further limiting selection of the bonding agent. For these optoelectronic devices, it the bonding layer may be substantially optically transparent. To be substantially optically transparent, as above the bonding layer has an absorption coefficient at the wavelength of the light emitted by the bonded structure (or, in the case of photodetectors, the light absorbed by the active layers) such that the bonding layer does not appreciably affect device performance. For example, the bonding layer may absorb from about 20% to less than about a few percent of the light, depending on the device and bonding layer (including bonding layer thickness). More specifically, depending on the application various bonding agents, such as metals, can be employed to completely block or reflect incident light over different spectrums. Other materials absorb some or most of the incident light (depending on the wavelength of the incident light and the thickness of the bonding agent as well as the type of bonding agent). The microstructure of the bonding interface also plays a role in the optical transparency as scattering of light may take place at grain boundaries and structural defects, thereby decreasing the amount of light transmitted through the structure.

Figure 15:
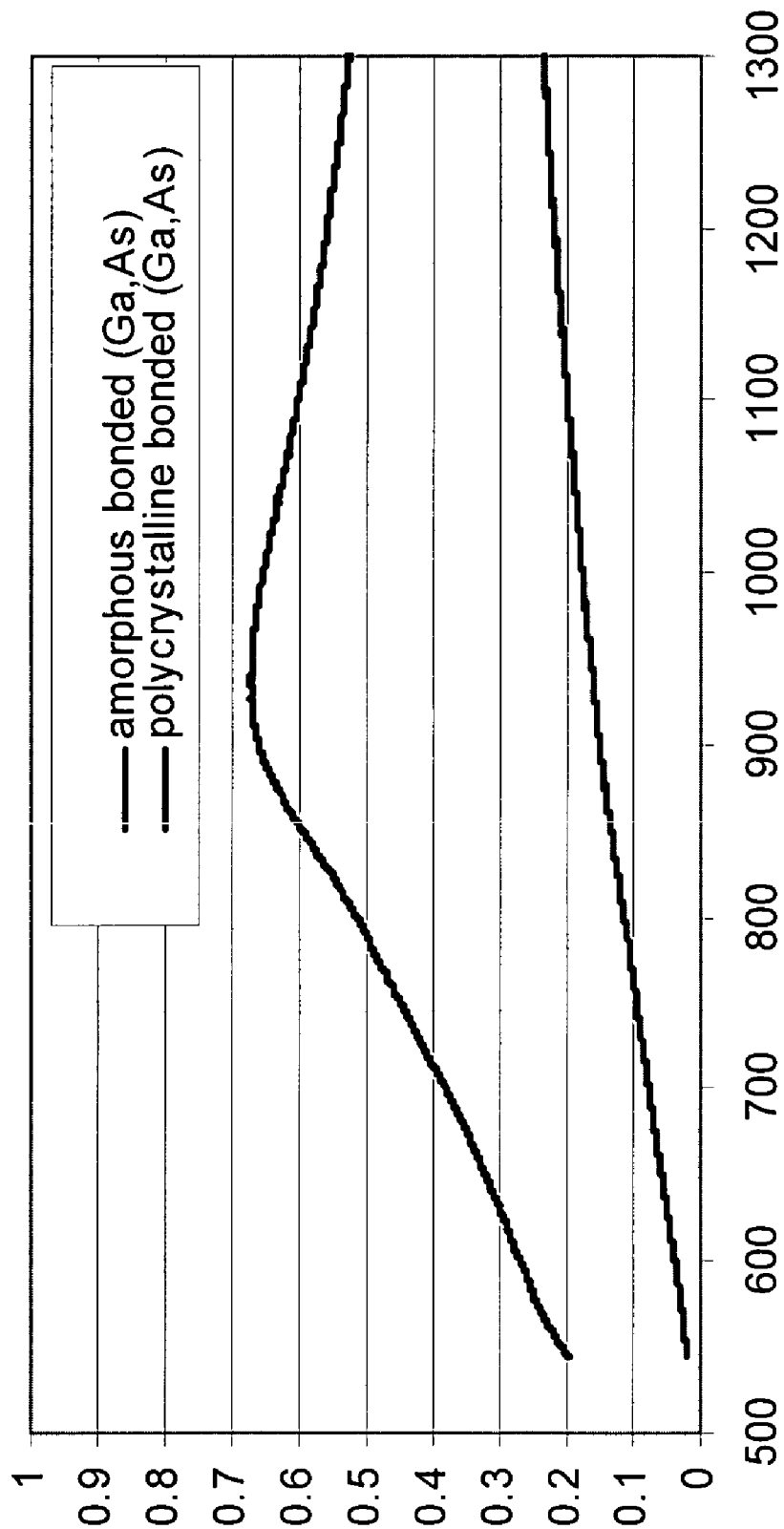
FIG. 15 compares the optical transparency of amorphous (Ga,As) and polycrystalline (Ga,As) bonded interface layers.

Measurements and comparisons of the absorption spectrum of amorphous (Ga,As) with that of a single crystal GaAs substrate show in general, that amorphous (Ga,As) absorbs much more than its single crystal counterpart almost for any wavelength of the incident light. In particular, single crystal GaAs shows a negligible absorption coefficient for light having energy that is less than the bandgap energy of GaAs while amorphous (Ga,As) still absorbs a non-negligible amount at those wavelengths. The absorption of light at various wavelengths by amorphous (Ga,As) is useful as particular device applications have different requirements. For example, the absorption of the bonding layer at wavelengths near 650 nm is important for high brightness red LEDs to be able to determine the maximum allowable thickness of the bonding layer for a particular device efficiency. In general, the amount of light transmission through a uniform medium decreases exponentially with the product of absorption coefficient and thickness of the absorbing material. Thus, a thinner absorbing layer allows more light transmission. To this end, the light transmission of two different GaP substrates was examined. The GaP substrates were bonded with 500' each (1000' total) of low temperature grown (Ga,As). One (Ga,As) bonding layer was amorphous and the other was polycrystalline after having been annealed at 400° C. for one hour. A comparison between the optical transparencies of the two different bonded interface layers is shown in FIG. 15. It is clear that polycrystalline (Ga,As) allows more light transmission than the amorphous (Ga,As) at all wavelengths. There is still decent light transmission of about 20% for 550 nm light through the polycrystalline (Ga,As) bonding layer. The energy of 550 nm light is about 0.8 eV above the GaAs bandgap energy. For light of 650 nm, a 1000 layer of polycrystalline (Ga,As) allows about 30% transmission.

Figure 16:
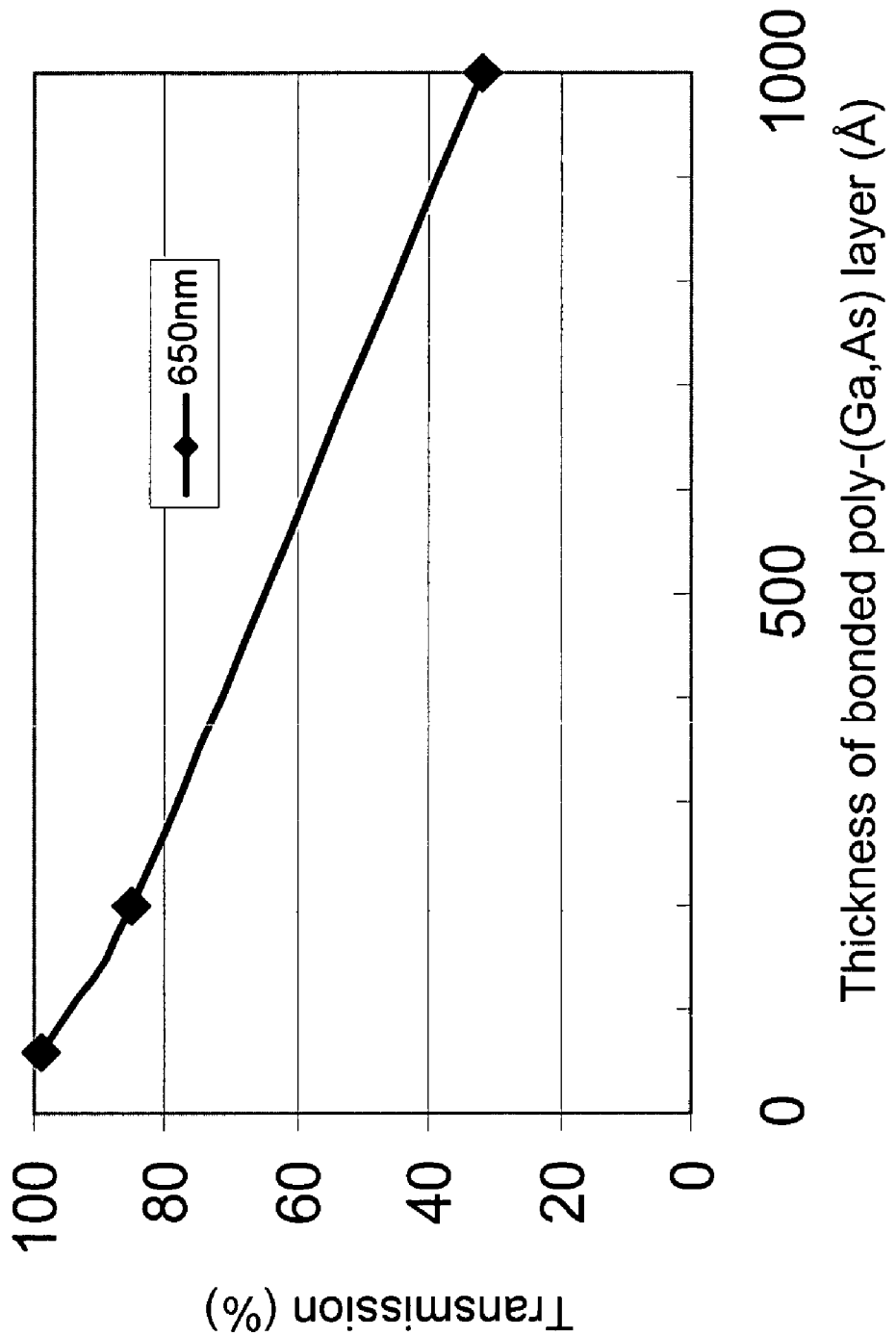
FIG. 16 shows the light transmission as a function of thickness at 650 run of GaP substrates bonded with polycrystalline (Ga,As) layers.

As above, thinner bonding layers may be used to increase the light transmission through the bonding layer. Measurements of the light transmission at 650 nm of GaP substrates bonded with polycrystalline (Ga,As) layers are shown FIG. 16. Relative light transmissions of 84% and 99% have been achieved with polycrystalline (Ga,As) layers of 200 Å and 60 Å, respectively, while providing a strong bond between the GaP wafers. In other words, structural bonding can be achieved with a low temperature semiconductor bonding agent as thin as 60 Å without sacrificing a substantial amount of bond strength. While 60 Å may seem small, the lower bound of thickness for adequate bonding has not yet been determined. In addition, as shown in FIG. 16, substantial transparency (e.g. 99% transmission) can be achieved as long as a very thin bonding agent is used, even though the energy of the light incident on the bonding agent is much higher than the bandgap energy/absorption edge of the bonding agent. Making the bonding layer very thin allows the wafer bonding process described herein to be used for applications in which light of even shorter wavelength (such as green, blue or ultraviolet) is of interest, even if the bond is substantially transparent to only a limited spectrum of light.

Figure 17:
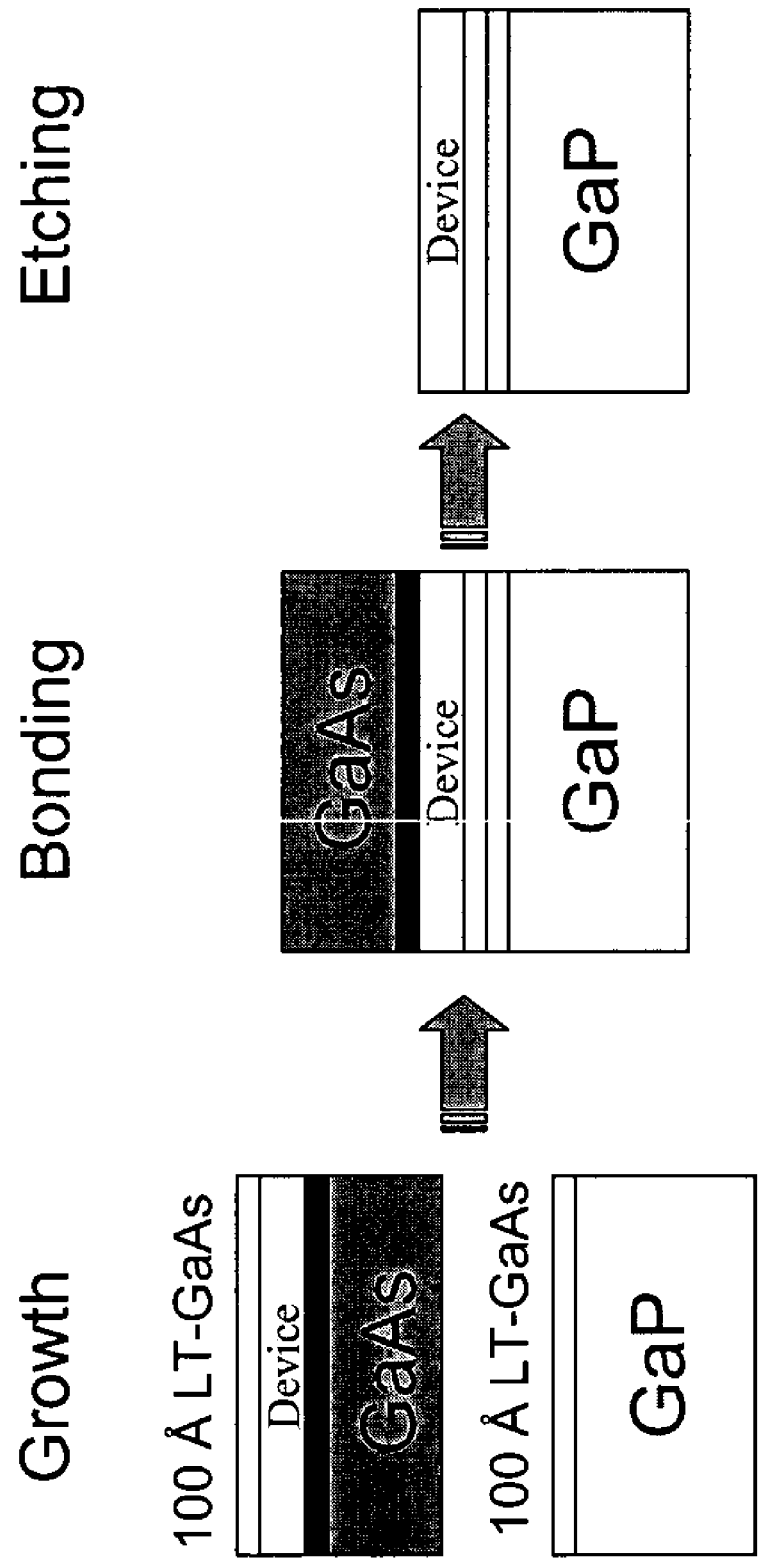
FIG. 17 is a flow chart representing the transfer of the device layer on a GaP substrate while utilizing polycrystalline (Ga,As) material as the bonding medium.
Figure 18:
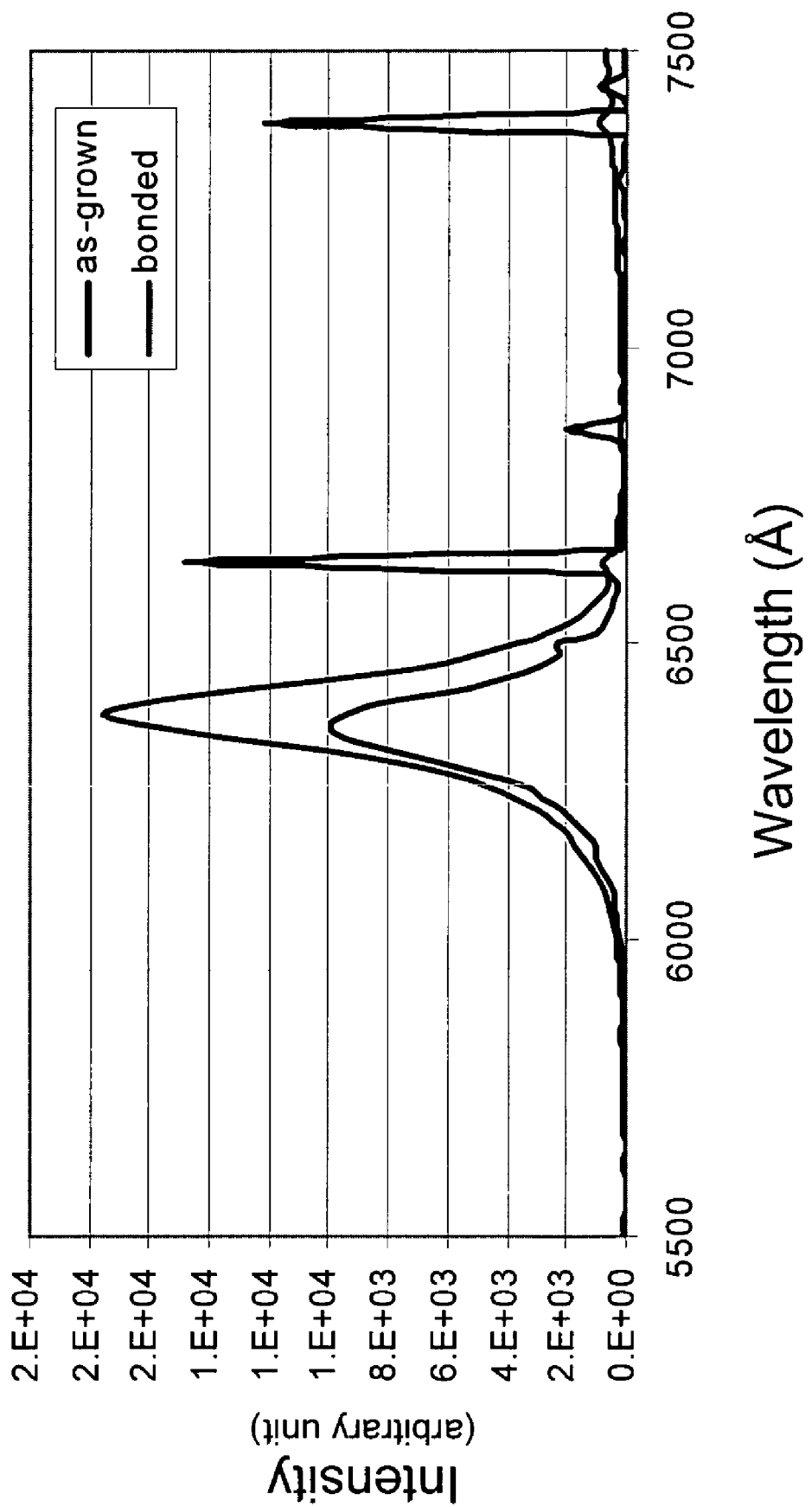
FIG. 18 is a graph of the 77K photoluminescence measurements on an as-grown (GaAs substrate) and bonded sample (GaP substrate).

As mentioned above, one possible application utilizing adhesive bonding with low temperature grown compound semiconductors is the fabrication of high brightness LEDs for red, green, blue and UV emission on transparent substrates. FIG. 17 illustrates a processing graph flow chart representing the transfer of the device layer on a GaP substrate while utilizing polycrystalline (Ga,As) material as the bonding agent. In the new low temperature process, the device, such as an InGaP-based LED structure, is initially grown latticematched on a GaAs substrate. The GaAs substrate absorbs the emission light of the active layer(s) of about 650 nm and thus must be removed. Any cleaning/oxide removal or other processing steps are not shown for simplicity. The LED structure is then moved to a different growth reactor for deposition of a thick, transparent GaP current spreading layer using VPE. The current spreading layer is larger than 50 μm and is physically thick and strong enough so that it provides support for the processing of the structure during substrate removal. Next, the GaAs substrate is removed, leaving only the device structure and the VPE GaP layer. In the conventional process, these layers are then bonded to another GaP substrate using direct wafer fusion to complete the final structure before further device processing occurs.

In one embodiment, the direct wafer fusion process is replaced by adhesive bonding using low temperature grown (Ga,As), (Ga,P) or (Ga,N) layers. The appropriate low temperature layers are grown on the device portion of the remaining structure as well as on a separate GaP substrate to be bonded to the device structure. The low temperature layers are then bonded. The thickness and crystallinity of the low temperature grown semiconductor layer are determined through an optimization process for the particular materials used. In general, each bonding layer is of the same type of material as the other bonding layer, although this is not necessary as long as the desired characteristics are achieved. Measurements of the photoluminescence on the as-grown (GaAs substrate) and bonded sample (GaP substrate) confirm that the bonded structure shows higher intensity because of the replacement by the transparent substrate. As above, the same bonding process may also be applied to LEDs of other wavelengths, such as infrared, yellow, green, blue and UV for a wider spectrum, not only because of the transparency of the bonding agent, but in addition because the lower bonding temperatures used and orientation independence of the electrical conduction.

Figure 19:
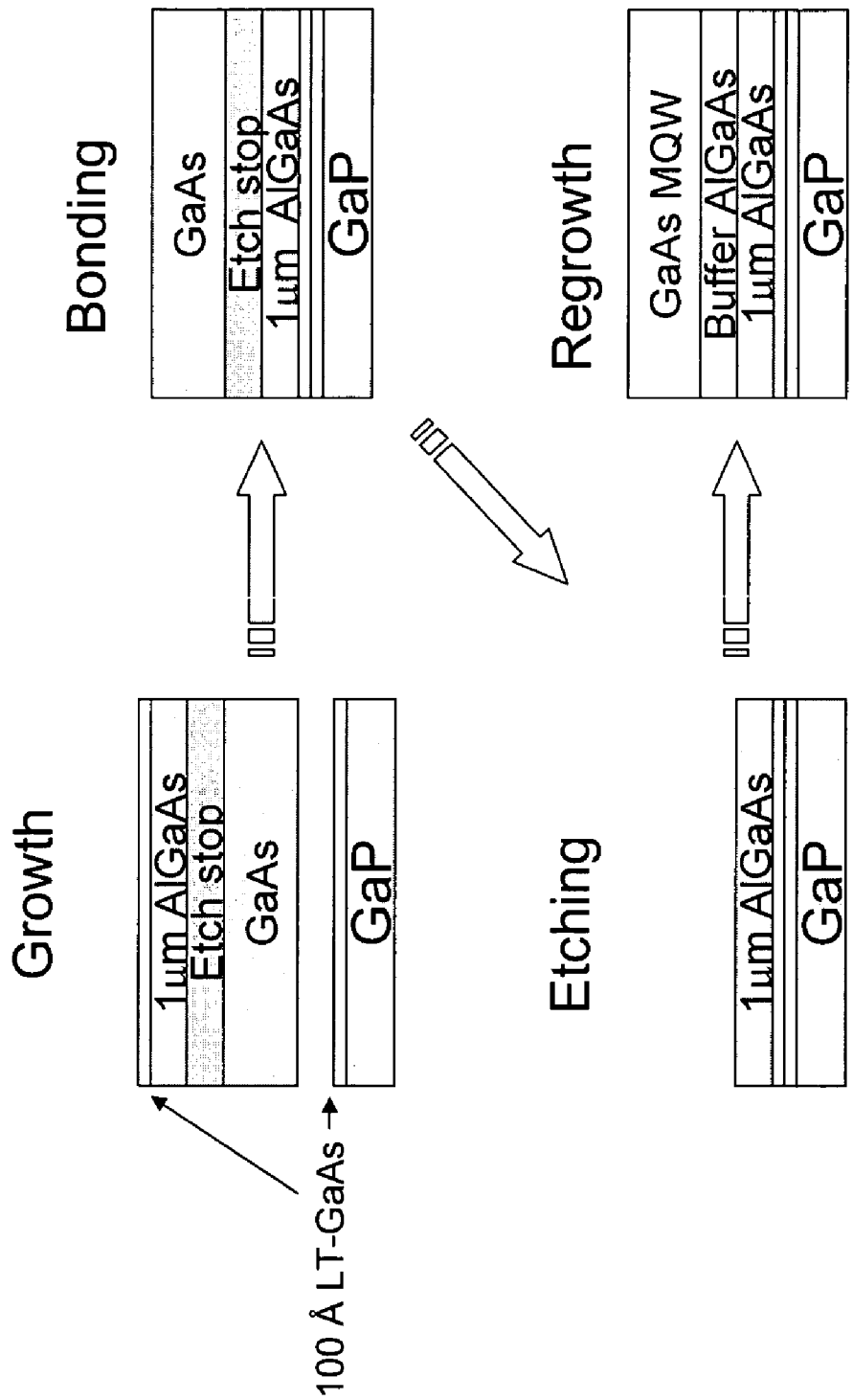
FIG. 19 is a flow chart representing transfer of a thin AlGaAs layer on a GaP substrate with polycrystalline (Ga, As) bonding agent.

Combining the formation of an optoelectronic device with the template growth described above, an LED device structure on a transparent substrate has been integrated through a regrowth process on a template. FIG. 19 illustrates a processing flow chart of such an embodiment in which a thin AlGaAs layer on a GaP substrate with polycrystalline (Ga,As) bonding agent is transferred. The AlGaAs layer serves as a template for regrowth of GaAs-based devices. In this embodiment, the various material layers including the $Al_{0.1}Ga_{0.9}As$ layer are grown, cleaned, and then bonded onto a transparent GaP substrate at an annealing temperature of 400° C. Subsequently, the absorbing substrate and etch stop layer are etched off, the template placed in the growth system for regrowth and then the desired transparent substrate and/or other layers are grown. As shown in the figure, a GaAs/AlGaAs multiple quantum well was grown on the template at 600° C. While the electrical properties of the two structures were similar, as expected in the control sample, the GaAs substrate absorbed the light emitted from the multiple quantum well active region and accordingly the photoluminescence results at both 300K (room temperature) and 77K show that the regrowth structure has higher photoluminescence intensity than the as-grown structure.

One of the best techniques for investigating the structural and optical properties of these structures is photoluminescence. Photoluminescence is a non-destructive technique in which light from a light source impinges on and is absorbed by the structure, the structure then emits light of a wavelength characteristic of the structure, and the wavelength and amount of light emitted by the structure is then measured. In general, the larger the amount of light emitted by the structure, the better the structure. The results above provide further evidence that such an optoelectronic device is not harmed by the low temperature grown semiconductor bonding layer, and thus that adhesive bonding with low temperature grown semiconductors can be used for regrowth applications.

Figure 20A:
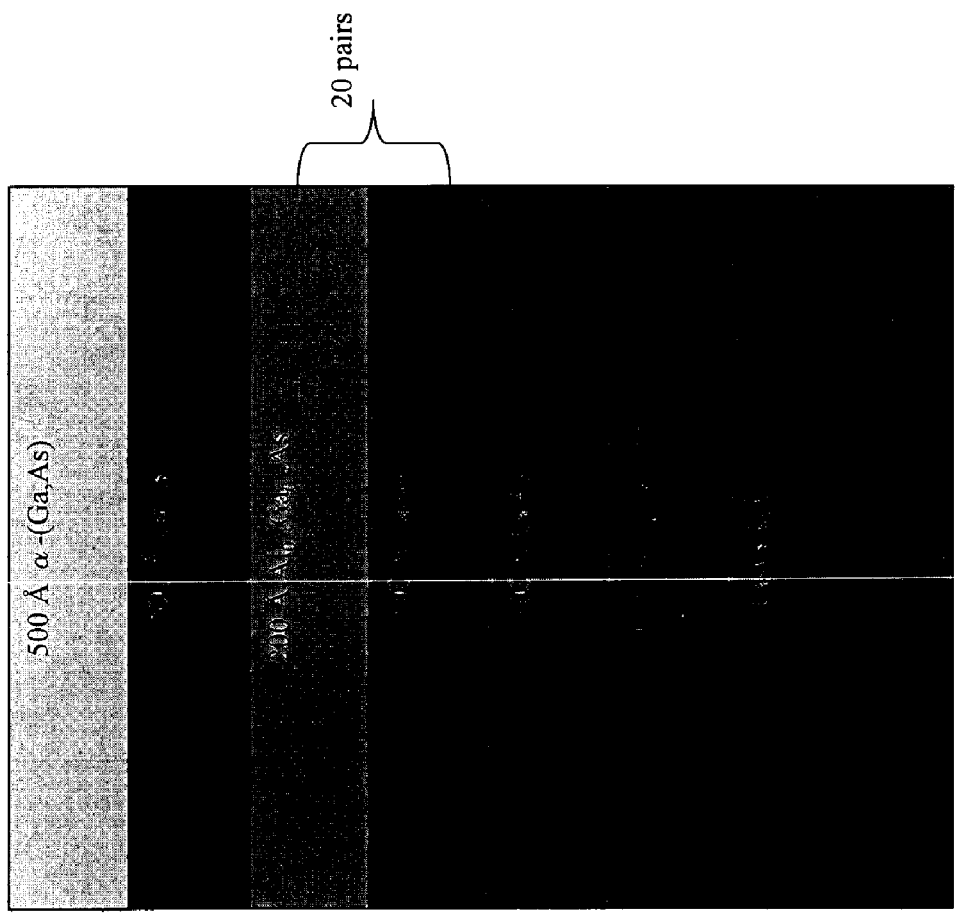
FIGS. 20(a) and 20(b) show a superlattice structure before and after regrowth, respectively.
Figure 20B:
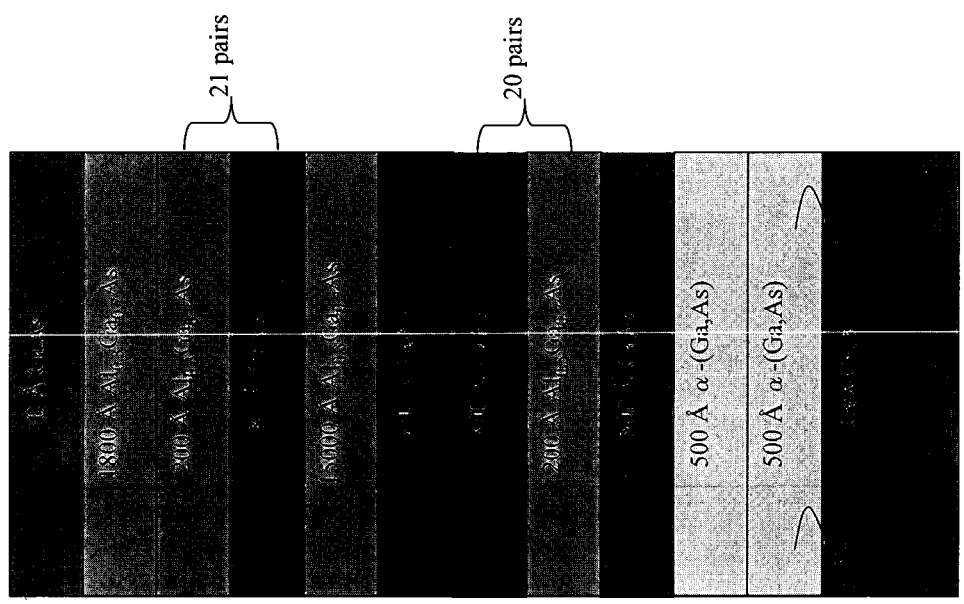

Another GaAs/$Al_{0.3}Ga_{0.7}As$ superlattice structure was grown and is shown in FIG. 20(a). The structure has a 500 Å, silicon doped low temperature grown (Ga,As) layer on top for bonding. Two pieces of this structure were cleaved into 1 cm×1 cm samples and bonded together at 400° C. for 20 min. After the bonding, one side of the bonded pair was polished to a thickness of approximately 50 µm. The sample was then etched to the etch stop layer using a citric acid:hydrogen peroxide (4:1) mixture under slight agitation. The culmination of the etching was clear because the initially rough substrate backside would become smooth once the etch stop layer was reached. The etch stop layer was then removed with HCl and this removal could be clearly seen by a sample color change. Immediately prior to regrowth, the sample was again etched in HCl for 5 minutes to remove any surface oxide. The sample was loaded into the growth chamber and a second quantum well structure was grown on the new seed layer, which is shown in FIG. 20(b).

Figure 21:
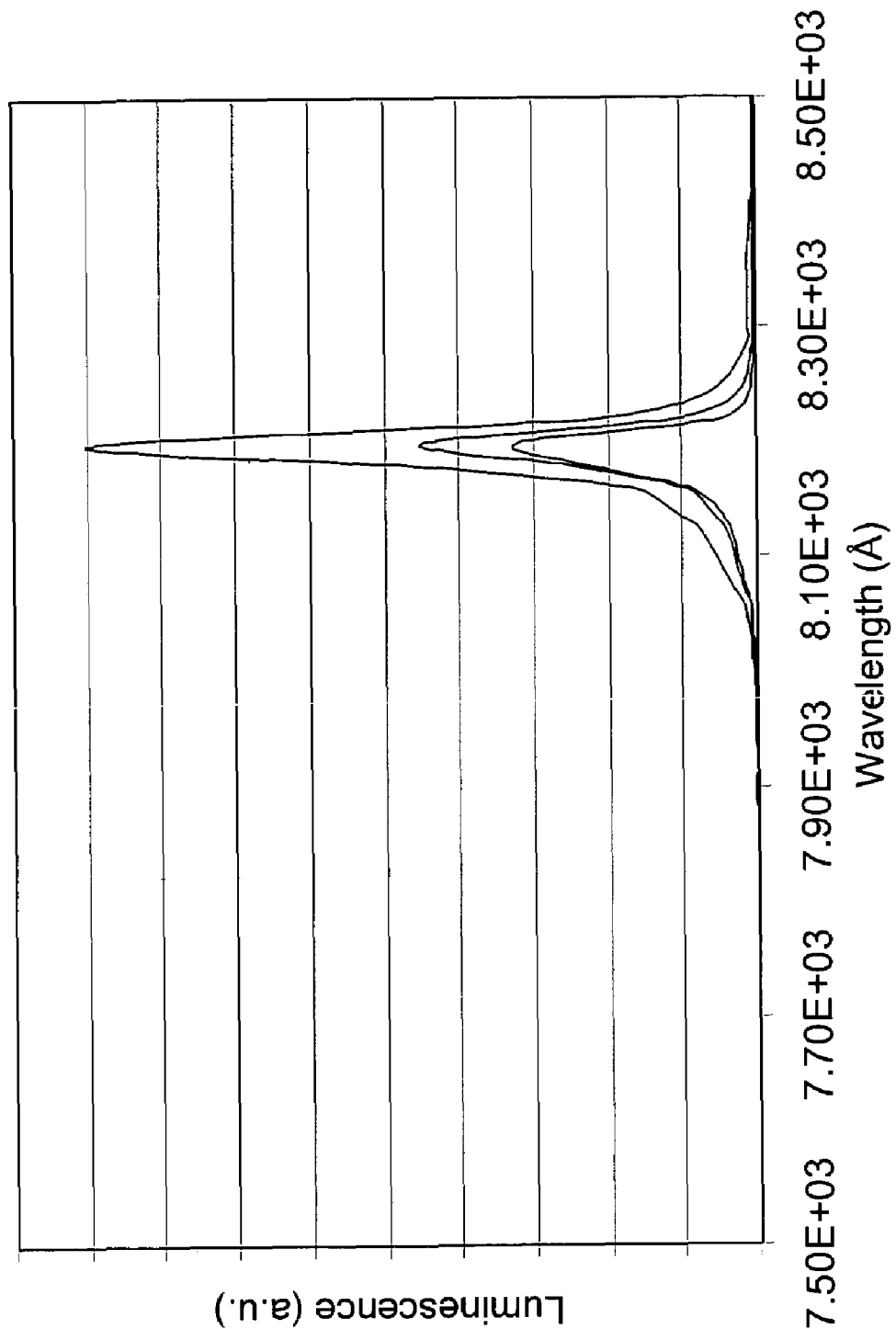
FIG. 21 shows photoluminescence measurements of the structure shown in FIG. 20(b).

Photoluminescence was again used to check the quality of the material after various stages. The two stages that were compared were immediately after bonding and after regrowth. The photoluminescence after bonding was checked by removing the substrate to expose the original epilayers. The photoluminescence of this material was compared to material that did not go through the bonding process. The results of these measurements are shown in FIG. 21. The figure shows two points in the bonded material and one point of the as-grown material with major noise peaks removed. All measurements were performed at 77 K. The luminescence of the as-grown material is about twice that of the bonded material. This may be due to damage created in the superlattice structure during the bonding process, or due to a different thickness of GaAs on the surface of the photoluminescence samples. The 500 Å (Ga,As) bonding layer was etched from the as-grown sample before photoluminescence testing using a sulfuric acid: hydrogen peroxide mixture. However, this etch may have etched some of the 500-Å single crystal GaAs layer, making that cap on that sample thinner than the cap on the bonded sample. A thinner cap results in higher luminescence.

Figure 22:
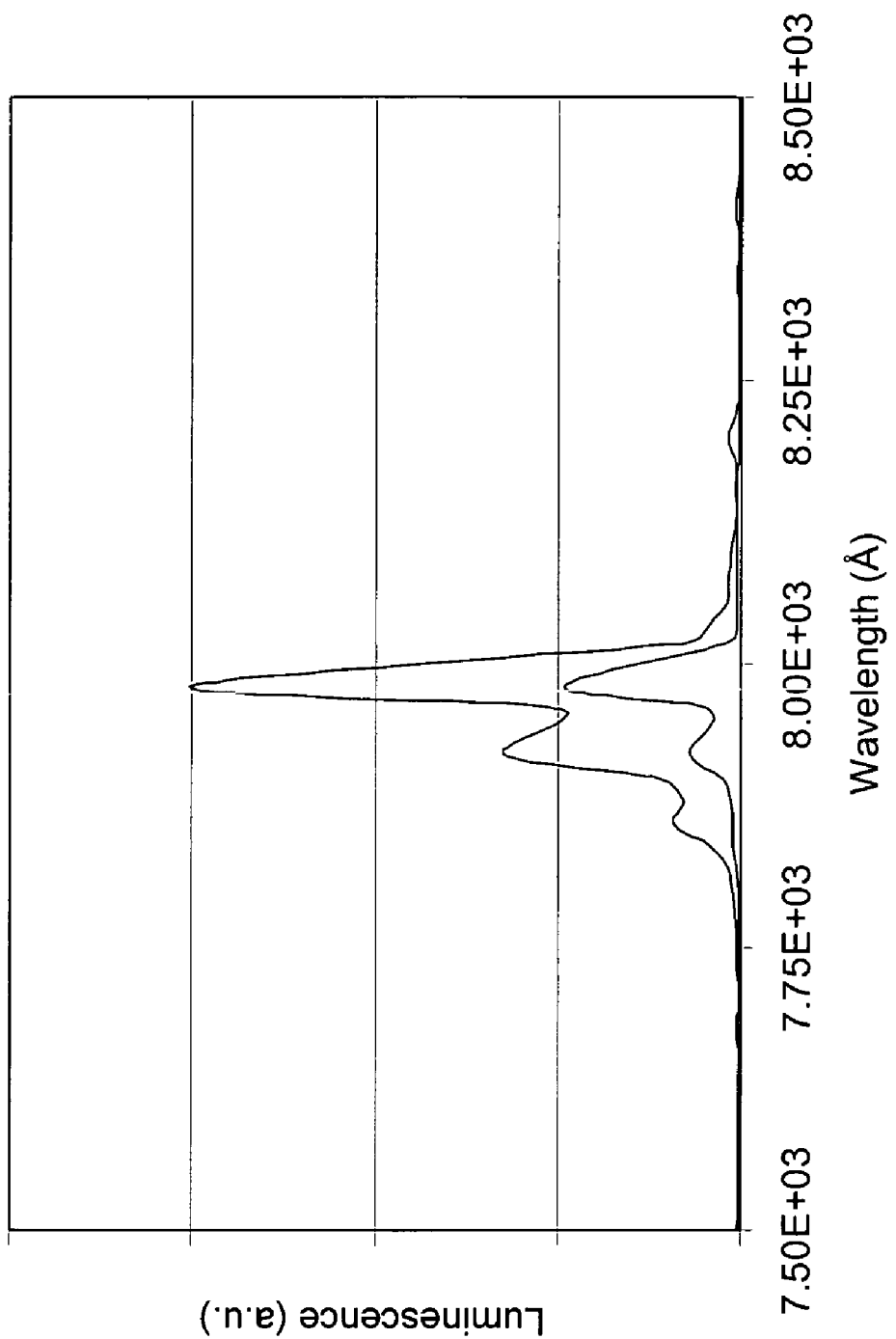
FIG. 22 shows photoluminescence measurements of another superlattice structure.

A second photoluminescence measurement set was made for samples that had undergone regrowth. These samples were prepared as described above and have the structure shown in FIG. 20(b). For comparison, another sample was grown simultaneously with the same structure on a GaAs substrate with no abnormal preparation. Photoluminescence of these materials is shown in FIG. 22. These measurements were performed at 77 K and all significant noise peaks have been removed. Three peaks are visible in both samples likely due to variations in the quantum wells during growth. The bonded sample also has a very small peak at a longer wavelength due to the quantum wells in the original structure. The unbonded sample displayed luminescence about three times that of the bonded material. This perhaps indicates that the quality of the regrown material may not be quite as high as that of materials grown on normal GaAs substrates.

Experiments were also performed to demonstrate conduction through the bonds of two bonded structures containing a 500 Å, silicon doped low temperature grown (Ga,As) bonding layer. The substrates being bonded were n-type GaAs substrates doped n-type to a level of 1 to about $2.4 \times 10^{18}$ cm$^{-3}$. Bonding was performed at 400° C. for either 20 min or 1 h. For both bonding durations, samples appeared to be strongly bonded and could not be separated with a razor blade. Contact was made to both substrates that were bonded by depositing In—Sn solder and then annealing at 350° C. for 2 min. The structures were initially measured in their as-bonded state using low current density due to the large size (~1 cm×1 cm). These results showed the bonds to be ohmic. In order to increase the current density, these structures were broken into smaller pieces. The bonds held up very well through this process.

Figure 23:
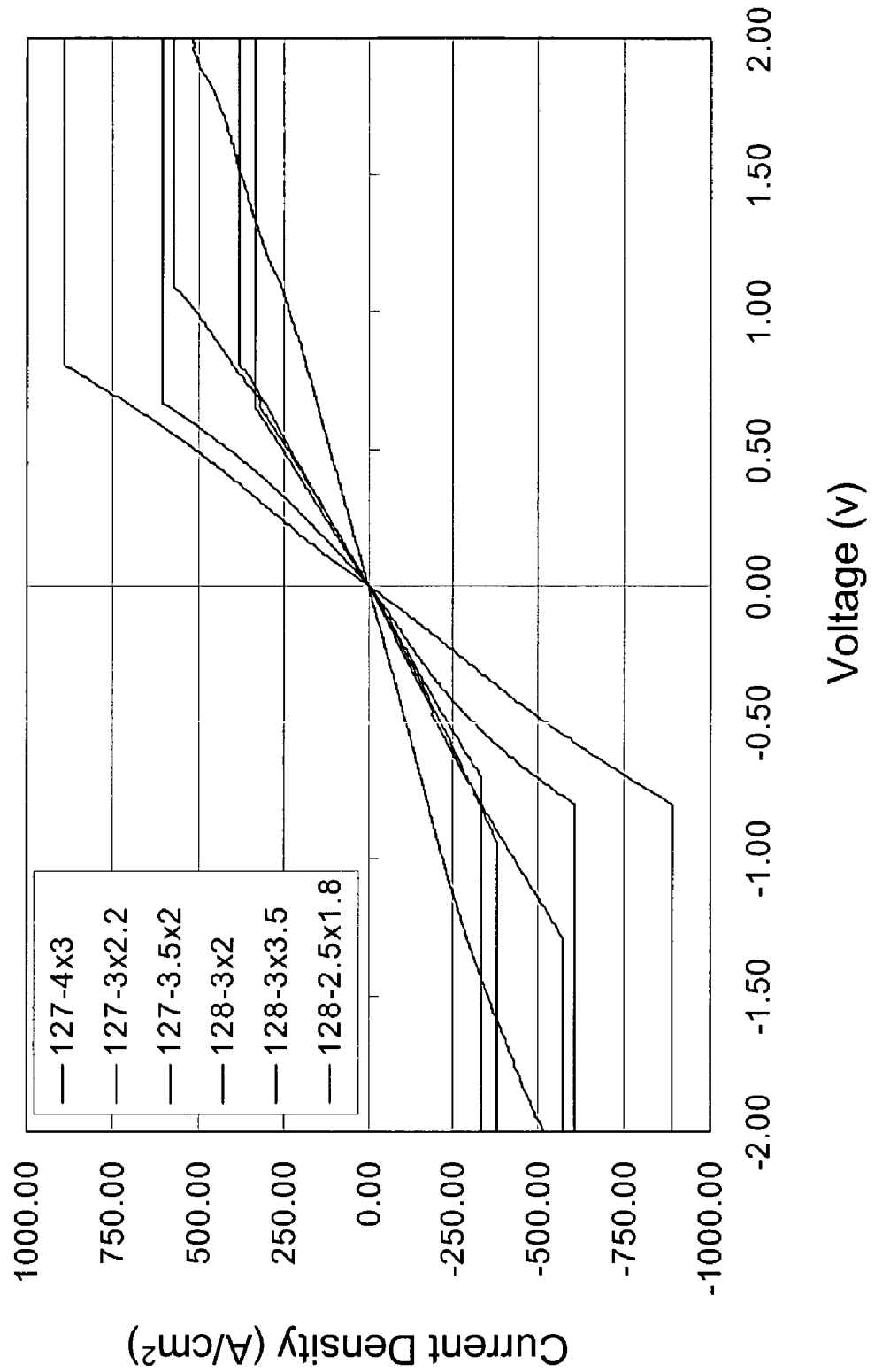
FIG. 23 shows J-V conduction measurements for several different sizes of bonded samples.

Conductance tests were repeated for the now smaller samples and the results can be seen in FIG. 23. Currents have been adjusted to current density to accommodate for different sample sizes. Current density increases to a point and then levels off due to the compliancy settings of the tests. A maximum current of 40 mA was used for all the tests in this figure. As can be seen, the structures all appear linear. Discrepancies in the figure may be due to nonuniformity in the bonding, damage to the pieces during the process to break up the samples, or inaccuracies measuring the area of the samples.

Although all the bonds appear to have a very linear conduction, the resistance is actually very high. The most conductive test in FIG. 23 demonstrates a resistance of 20Ω for a sample that is roughly 1.8×2.5 mm. From the resistivity of the substrates, the resistance of the substrates is negligible. Thus, essentially all of the resistance is contributed by the roughly 1000 Å bonding layer (a resistivity of $9 \times 10^4$ Ω-cm). It is more likely that the conduction is actually nonlinear, but the current density is too small to show this nonlinearity. It is certain that the conduction is limited in the bonding layer. Barriers to conduction in the bonding layer are between the single crystal layer and the substrate, in any single crystal epitaxy that may have occurred in the low temperature grown (Ga,As) during the bonding process, and at the true bond interface.

In summary, conventional direct wafer fusion technique has benefits over adhesive bonding with a conventional bonding agent. Among the wide variety of bonding agents, including polymers, ceramics, semiconductors and metals, each bonding agent has its own advantages and shortcomings. In general, polymers cannot withstand post-bonding high temperature annealing. Ceramics usually don't conduct electrically. Metals often react with the bonded substrates to form intermetallic compounds during prolonged high-temperature annealing or block light. Using adhesive bonding with low temperature grown III-V semiconductors, however, provides benefits over all of the conventional methods.

Firstly, as described above, this material and process can be used to bond various substrates such as semiconductor materials as well as non-semiconductor materials such as glass or metal. The materials being bonded do not have to be of any particular type of structure or composition. Secondly, the polycrystalline semiconductor layer obtained from the annealing does not have specific or preferred crystal orientation. This independence from specific orientation alleviates the misorientation and alignment problems encountered for non-ohmic current conduction found in direct wafer bonding. Thirdly, the recrystallized non-Al-containing material has better resistance to wet oxidation of Al-containing layer, which may be used in later processing steps such as those used during fabrication of VCSELs or MOSFETs. Fourthly, the bonding can be performed at a relatively low temperature that is not damaging to the substrates or other materials on the substrates. In comparison, previous bonding techniques typically have a much more limited and higher range of temperatures that must be used and that are damaging to the other materials in the structure. For example, conventional direct wafer bonding for single crystal GaP materials requires over 750° C. to achieve strong bonding. In contrast, the present method uses about 400° C. to bond GaAs, GaP, GaSb or even GaN/sapphire substrates utilizing an amorphous/polycrystalline (Ga,As) layer or about 600° C. utilizing an amorphous/polycrystalline (Ga,P) layer as the bonding agent, which is still considerably lower than 750° C. Similarly, while using an amorphous/polycrystalline (Ga,N) as the bonding agent, a higher annealing temperature such as 800° C. may be needed, a lower bound has not yet been determined. Conventional direct wafer bonding for single crystal GaN/sapphire materials and devices, however, requires over 1000° C. to achieve strong bonding. Fifthly, bonds are formed that are physically strong enough to survive later processing, such as polishing, and thermally stable enough to survive prolonged annealing at reasonably high temperatures, such as those used for epitaxial growth or other post-bonding annealing. In the latter case, such annealing does not induce adverse effects on the microstructure near the bonding interface. Sixthly, a usable bonding layer with a thickness of down to about 3 nm has been produced. Although the layer thickness may be smaller than about 3 nm or larger than about 600 nm, thinner layers have not yet been produced and tested while thicker layers may decrease throughput by taking longer without adding a proportional amount of benefit to the bonding characteristics. Lastly, this bonding layer may be electrically conductive, optically transparent, and temperature stable.

Moreover, this adhesive bonding has been laboratory tested many times for various materials with excellent results. The bonding temperature, substrates being bonded, and bonding layer may be altered without changing the overall process as long as sufficient bonding strength is attained. This last factor has much room for variation including both the choice of the bonding layer (e.g. (Ga,As), (Ga,P), (Ga,N) or some other semiconductor) and the physical properties of that material (e.g. growth conditions, metallurgical conditions, doping).

Strong and optically transparent bonds have been formed using amorphous or polycrystalline (Ga,As) in the bonding of GaAs to GaAs, GaAs to InP, InP to GaAs grown on Si, GaAs to GaP, and GaP to GaP. Also amorphous and polycrystalline (Ga,P) has been used to form strong, transparent bonds between GaAs and GaP as well as GaP and GaP. In addition, amorphous/polycrystalline (Ga,N) has been used to form strong transparent bonds between GaN and sapphire. Bonding other semiconductor substrates such as Si, GaSb, GaN, SiC, and sapphire are possible as well using this process. The bonding layer may comprise low temperature grown (Ga,As), (Ga,P), (Ga,N), (Ga,Sb), (In,As) and others, ternary compounds such as (In,Ga,P) or (In,Ga,As) and others, or quaternary compounds such as (In,Ga,As,P) and others. The existence of an electrically conductive bond has been shown when using Ga-rich polycrystalline (Ga,P) or polycrystalline (Ga,As) as a bonding agent and bonding GaP to GaP. The optimal combination of both III/V stoichiometry and thickness of the low temperature semiconductors for achieving the best combination of high electrical conductance and optical transparency across the bonding interface using this adhesive bonding technology may be determined by using this process.

It is therefore intended that the foregoing detailed description be regarded as illustrative rather than limiting, and that it be understood that it is the following claims, including all equivalents, that are intended to define the spirit and scope of this invention.

The invention claimed is:

1. A method of bonding two structures together, the method comprising:
depositing low temperature grown semiconductor bonding layers on first and second structures by molecular beam epitaxy (MBE) at a temperature of at most about 100° C., wherein at least one of the bonding layers comprises an amorphous material;
placing the bonding layers in contact with each other to form a combined structure;
applying pressure to the combined structure; and
annealing the combined structure under conditions sufficient for the bonding layers to bond the first and second structures together,
wherein the annealing comprises crystallizing at least a portion of the amorphous material to a polycrystalline material.

2. The method of claim 1, further comprising applying the pressure substantially uniformly to the combined structure during annealing.

3. The method of claim 1, wherein the bonding layers comprise at least one of amorphous gallium arsenide and polycrystalline gallium arsenide and the annealing of the combined structure occurs at a temperature of between about 300° C. and 500° C. and for a time sufficient for the bonding layers to form a gallium arsenide material that is substantially entirely polycrystalline.

4. The method of claim 1, wherein the bonding layers comprise at least one of amorphous gallium phosphide and polycrystalline gallium phosphide and the annealing of the combined structure occurs at a temperature of between about 500° C. and 700° C. and for a time sufficient for the bonding layers to form a gallium phosphide material that is substantially entirely polycrystalline.

5. The method of claim 1, wherein the layers comprise at least one of amorphous gallium nitride and polycrystalline gallium nitride and the annealing of the combined structure occurs at a temperature of between about 700° C. and 900° C.

and for a time sufficient for the bonding layers to form a gallium nitride material that is substantially entirely polycrystalline.

6. The method of claim 1, wherein the bonding layers are placed in contact with each other without regard for a relative angular orientation of the first and second structures to each other.

7. The method of claim 1, wherein at least one of the first and second structures comprises a non-semiconductor substrate.

8. The method of claim 1, further comprising fabricating at least one of an electronic and optoelectronic device from the combined structure.

9. The method of claim 1, wherein the annealing of the combined structure occurs under conditions that are not damaging to the first and second structures but are sufficient to form bonds that are strong enough to survive subsequent processing at temperatures higher than those used during the bonding.

10. The method of claim 1, wherein a bonding interface produced by the annealing is substantially optically transparent to light emitted by the combined structure.

11. The method of claim 1, wherein a bonding interface produced by the annealing is strong enough to be substantially unaffected by processing of the combined structure.

12. The method of claim 1, wherein the deposition deposits between about 3 nm and about 600 nm of material on each of the first and second structures.

13. The method of claim 1, wherein the deposition deposits at least one of low temperature grown gallium arsenide, gallium phosphide and gallium nitride on at least one of the first and second structures.

14. The method of claim 1, further comprising selecting a composition of the bonding layers such that a polycrystalline semiconductor layer is deposited on one of the first and second structures.

15. The method of claim 14, wherein the annealing of the combined structure occurs under conditions sufficient for the polycrystalline semiconductor layer to recrystallize.

16. The method of claim 1, wherein the annealing occurs at temperatures of at most about 800° C.

17. The method of claim 1, wherein the bonding layers comprise a compound semiconductor.

18. The method of claim 17, further comprising doping the bonding layers with Si.

19. The method of claim 17, further comprising doping the bonding layers with a dopant that helps to control morphology of the compound semiconductor.

20. The method of claim 1, wherein the first and second structures are separate structures from each other before the bonding layers are placed in contact and the combined structure is annealed.

21. The method of claim 1, wherein at least one of the first and second structures comprises a semi-insulating substrate.

22. The method of claim 1, wherein at least one of the first and second structures comprises an insulator.

23. The method of claim 1, wherein at least one of the first and second structures comprises a pseudomorphic structure.

24. The method of claim 1, wherein the bonding layers are devoid of polymers, ceramics, and metals.

25. A method of bonding two structures together, the method comprising:
depositing low temperature grown compound semiconductor bonding layers on separate first and second structures, wherein at least one of the bonding layers comprises one of gallium arsenide, gallium phosphide, and gallium nitride, and further wherein at least one of the bonding layers comprises an amorphous material;
placing the bonding layers of the separate first and second structures in contact with each other,
applying pressure to a combined structure of the first and second structures and the bonding layers; and
annealing the combined structure under conditions sufficient for the bonding layers to bond the first and second structures together,
wherein the annealing comprises crystallizing at least a portion of the amorphous material to a polycrystalline material.

26. The method of claim 25, further comprising applying the pressure substantially uniformly to the combined structure during annealing.

27. The method of claim 25, wherein the bonding layers comprise at least one of amorphous gallium arsenide and polycrystalline gallium arsenide and the annealing of the combined structure occurs at a temperature of between about 300° C. and 500° C. and for a time sufficient for the bonding layers to form a gallium arsenide material that is substantially entirely polycrystalline.

28. The method of claim 25, wherein the bonding layers comprise at least one of amorphous gallium phosphide and polycrystalline gallium phosphide and the annealing of the combined structure occurs at a temperature of between about 500° C. and 700° C. and for a time sufficient for the bonding layers to form a gallium phosphide material that is substantially entirely polycrystalline.

29. The method of claim 25, wherein the bonding layers comprise at least one of amorphous gallium nitride and polycrystalline gallium nitride and the annealing of the combined structure occurs at a temperature of between about 700° C. and 900° C. and for a time sufficient for the bonding layers to form a gallium nitride material that is substantially entirely polycrystalline.

30. The method of claim 25, wherein at least one of the first and second structures comprises a non-semiconductor substrate.

31. The method of claim 25, wherein the annealing of the combined structure occurs under conditions that are not damaging to the first and second structures but are sufficient to form bonds that are strong enough to survive subsequent processing at temperatures higher than that used during the bonding.

32. The method of claim 25, wherein a bonding interface produced by the annealing is substantially optically transparent to light emitted by the combined structure.

33. The method of claim 25, further comprising selecting a composition of the bonding layers such that a polycrystalline semiconductor layer is deposited on one of the first and second structures.

34. The method of claim 33, wherein the annealing of the combined structure occurs under conditions sufficient for the polycrystalline semiconductor layer to recrystallize.

35. The method of claim 25, wherein the annealing occurs at temperatures of at most about 800° C.

36. The method of claim 25, further comprising doping the bonding layers.

37. The method of claim 25, wherein the bonding layers are placed in contact with each other without regard for a relative angular orientation of the first and second structures to each other.

38. The method of claim 25, wherein the bonding layers are deposited by molecular beam epitaxy (MBE) at a temperature of at most about 100° C.

39. The method of claim 1, wherein the bonding layers on the first and second structures comprise a substantially identical material composition.

40. The method of claim 1, wherein applying pressure to the combined structure comprises applying an external pressure to the combined structure.

41. The method of claim 1, wherein both bonding layers comprise an amorphous material.

42. The method of claim 1, wherein the annealing comprises crystallizing substantially all of the amorphous material to a polycrystalline material.

43. The method of claim 1, wherein at least one of the bonding layers comprises a ternary or quaternary compound.

44. The method of claim 43, wherein the ternary or quaternary compound is selected from the group consisting of indium gallium arsenide, indium gallium phosphide, and indium gallium arsenide phosphide.

45. The method of claim 25, wherein the bonding layers on the first and second structures comprise a substantially identical material composition.

46. The method of claim 25, wherein applying pressure to the combined structure comprises applying an external pressure to the combined structure.

47. The method of claim 25, wherein both bonding layers comprise an amorphous material.

48. The method of claim 25, wherein the annealing comprises crystallizing substantially all of the amorphous material to a polycrystalline material.

49. The method of claim 25, wherein at least one of the bonding layers comprises a ternary or quaternary compound.

50. The method of claim 49, wherein the ternary or quaternary compound is selected from the group consisting of indium gallium arsenide, indium gallium phosphide, and indium gallium arsenide phosphide.

51. A method of bonding two structures together, the method comprising:
   depositing low temperature grown semiconductor bonding layers on first and second structures, wherein at least one of the bonding layers comprises one of gallium arsenide, gallium phosphide, and gallium nitride, and further wherein at least one of the bonding layers comprises an amorphous material;
   placing the bonding layers in contact with each other to form a combined structure;
   applying pressure to the combined structure; and
   crystallizing at least a portion of the amorphous material of the bonding layers to a polycrystalline material during the application of pressure to bond the first and second structures together.

52. The method of claim 51, wherein crystallizing at least a portion of the amorphous material to a polycrystalline material comprises annealing the combined structure.

53. The method of claim 52, wherein the annealing occurs for a time sufficient for crystallization of substantially all of the amorphous material to occur.

54. The method of claim 51, wherein the bonding layers comprise at least one of amorphous gallium arsenide and polycrystalline gallium arsenide and the crystallization occurs at an annealing temperature of between about 300° C. and 500° C.

55. The method of claim 51, wherein the bonding layers comprise at least one of amorphous gallium phosphide and polycrystalline gallium phosphide and the crystallization occurs at an annealing temperature of between about 500° C. and 700° C.

56. The method of claim 51, wherein the bonding layers comprise at least one of amorphous gallium nitride and polycrystalline gallium nitride and the crystallization occurs at an annealing temperature of between about 700° C. and 900° C.

57. The method of claim 51, wherein the crystallization of at least a portion of the amorphous material to a polycrystalline material occurs under conditions that are not damaging to the first and second structures but are sufficient to form bonds that are strong enough to survive subsequent processing at temperatures higher than those used during the bonding.

58. The method of claim 51, wherein a bonding interface produced by the crystallization is substantially optically transparent to light emitted by the combined structure.

59. The method of claim 51, wherein a bonding interface produced by the crystallization is strong enough to be substantially unaffected by processing of the combined structure.

60. A method of bonding two structures together, the method comprising:
   depositing low temperature grown semiconductor bonding layers on first and second structures, wherein at least one of the bonding layers comprises one of gallium arsenide, gallium phosphide, and gallium nitride, and further wherein at least one of the bonding layers comprises an amorphous material;
   placing the bonding layers in contact with each other to form a combined structure;
   applying pressure to the combined structure; and
   annealing the combined structure under conditions sufficient for the bonding layers to bond the first and second structures together,
   wherein the annealing comprises crystallizing at least a portion of the amorphous material to a polycrystalline material.

61. A method of bonding two structures together, the method comprising:
   depositing low temperature grown semiconductor bonding layers on first and second structures, wherein at least one of the bonding layers comprises an amorphous material;
   doping the semiconductor bonding layers with Si;
   placing the bonding layers in contact with each other to form a combined structure;
   applying pressure to the combined structure; and
   annealing the combined structure under conditions sufficient for the bonding layers to bond the first and second structures together,
   wherein the annealing comprises crystallizing at least a portion of the amorphous material to a polycrystalline material.

62. A method of bonding two structures together, the method comprising:
   depositing low temperature grown semiconductor bonding layers on first and second structures, wherein at least one of the bonding layers comprises a ternary or quaternary compound, and further wherein at least one of the bonding layers comprises an amorphous material;
   placing the bonding layers in contact with each other to form a combined structure;
   applying pressure to the combined structure; and
   annealing the combined structure under conditions sufficient for the bonding layers to bond the first and second structures together,
   wherein the annealing comprises crystallizing at least a portion of the amorphous material to a polycrystalline material.

63. A method of bonding two structures together, the method comprising:
   depositing low temperature grown semiconductor bonding layers on first and second structures by molecular beam epitaxy (MBE) at a temperature of at most about 100° C., wherein at least one of the bonding layers comprises an amorphous material;

placing the bonding layers in contact with each other to form a combined structure;

applying pressure to the combined structure; and crystallizing at least a portion of the amorphous material of the bonding layers to a polycrystalline material during the application of pressure to bond the first and second structures together.

* * * * *